US012510826B2

(12) United States Patent
Tan et al.

(10) Patent No.: US 12,510,826 B2
(45) **Date of Patent: *Dec. 30, 2025**

(54) PHOTORESIST DEVELOPMENT WITH HALIDE CHEMISTRIES

(71) Applicant: Lam Research Corporation, Fremont, CA (US)

(72) Inventors: Samantha SiamHwa Tan, Newark, CA (US); Jengyi Yu, San Ramon, CA (US); Da Li, Newark, CA (US); Yiwen Fan, Fremont, CA (US); Yang Pan, Los Altos, CA (US); Jeffrey Marks, Saratoga, CA (US); Richard A. Gottscho, Menlo Park, CA (US); Daniel Peter, Sunnyvale, CA (US); Timothy William Weidman, Sunnyvale, CA (US); Boris Volosskiy, San Jose, CA (US); Wenbing Yang, Campbell, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/769,048

(22) Filed: Jul. 10, 2024

(65) Prior Publication Data

US 2024/0361696 A1 Oct. 31, 2024

Related U.S. Application Data

(63) Continuation of application No. 17/596,648, filed as application No. PCT/US2020/039615 on Jun. 25, 2020, now Pat. No. 12,105,422.

(Continued)

(51) Int. Cl.

*G03F 7/36* (2006.01)
*G03F 7/004* (2006.01)

(Continued)

(52) U.S. Cl.

CPC ............ *G03F 7/167* (2013.01); *G03F 7/0042* (2013.01); *G03F 7/0043* (2013.01); *G03F 7/168* (2013.01); *G03F 7/36* (2013.01); *G03F 7/40* (2013.01)

(58) Field of Classification Search

CPC .......... G03F 7/36; G03F 7/167; G03F 7/0042; G03F 7/0043

See application file for complete search history.

(56) References Cited

U.S. PATENT DOCUMENTS 4,061,829 A 12/1977 Taylor
4,241,165 A 12/1980 Hughes et al.

(Continued)

FOREIGN PATENT DOCUMENTS

CN 1841201 A 10/2006
CN 102027577 A 4/2011

(Continued)

OTHER PUBLICATIONS

CN Office Action dated Dec. 2, 2024 in CN Application No. 202211142175.7, with English Translation.

(Continued)

*Primary Examiner* — Daborah Chacko-Davis
(74) *Attorney, Agent, or Firm* — Weaver Austin Villeneuve & Sampson LLP

(57) ABSTRACT

Development of resists are useful, for example, to form a patterning mask in the context of high-resolution patterning. Development can be accomplished using a halide-containing chemistry such as a hydrogen halide. A metal-containing resist film may be deposited on a semiconductor substrate using a dry or wet deposition technique. The resist film may be an EUV-sensitive organo-metal oxide or organo-metal- (Continued)

containing thin film resist. After exposure, the photopatterned metal-containing resist is developed using wet or dry development.

12 Claims, 15 Drawing Sheets

Related U.S. Application Data

(60) Provisional application No. 62/866,942, filed on Jun. 26, 2019.

(51) Int. Cl.
*G03F 7/16* (2006.01)
*G03F 7/40* (2006.01)

(56) References Cited

U.S. PATENT DOCUMENTS 4,292,384 A 9/1981 Straughan et al.
4,314,022 A 2/1982 Fisch
4,341,592 A 7/1982 Shortes et al.
4,396,704 A 8/1983 Taylor
4,738,748 A 4/1988 Kisa
4,806,456 A 2/1989 Katoh
4,834,834 A 5/1989 Ehrlich et al.
4,842,989 A 6/1989 Taniguchi et al.
4,940,854 A 7/1990 Debe
5,094,936 A 3/1992 Misium et al.
5,206,706 A 4/1993 Quinn
5,322,765 A 6/1994 Clecak et al.
5,683,857 A 11/1997 Shirai et al.
5,914,278 A 6/1999 Boitnott et al.
5,925,494 A 7/1999 Horn
6,013,418 A 1/2000 Ma et al.
6,045,877 A 4/2000 Gleason et al.
6,162,577 A 12/2000 Felter et al.
6,179,922 B1 1/2001 Ishikawa et al.
6,179,924 B1 1/2001 Zhao et al.
6,183,934 B1 2/2001 Kawamonzen
6,290,779 B1 9/2001 Saleh et al.
6,319,654 B1 11/2001 Kim et al.
6,448,097 B1 9/2002 Singh et al.
6,566,276 B2 5/2003 Maloney et al.
6,573,030 B1 6/2003 Fairbairn et al.
6,607,867 B1 8/2003 Kim et al.
6,666,986 B1 12/2003 Vaartstra
6,841,341 B2 1/2005 Fairbairn et al.
6,867,086 B1 3/2005 Chen et al.
7,112,489 B1 9/2006 Lyons et al.
7,169,440 B2 1/2007 Balasubramaniam et al.
7,223,526 B2 5/2007 Fairbairn et al.
7,307,695 B2 12/2007 Hazenberg et al.
7,335,462 B2 2/2008 Fairbairn et al.
7,438,534 B2 10/2008 Holland et al.
7,608,367 B1 10/2009 Aigeldinger et al.
8,083,862 B2 12/2011 Brown
8,536,068 B2 9/2013 Weidman et al.
8,703,386 B2 4/2014 Bass et al.
8,883,405 B2 11/2014 Shiobara
9,310,684 B2 4/2016 Meyers et al.
9,632,411 B2 4/2017 Michaelson et al.
9,735,002 B2 8/2017 Kawaguchi et al.
9,778,561 B2 10/2017 Marks et al.
9,790,595 B2 10/2017 Jung et al.
9,823,564 B2 11/2017 Stowers et al.
9,996,004 B2 6/2018 Smith et al.
10,025,179 B2 7/2018 Meyers et al.
10,074,543 B2 9/2018 Mahorowala et al.
10,228,618 B2 3/2019 Meyers et al.
10,304,668 B2 5/2019 Coppa et al.
10,416,554 B2 9/2019 Meyers et al.
10,514,598 B2 12/2019 Marks et al.
10,515,812 B1 12/2019 Wang et al.
10,627,719 B2 4/2020 Waller et al.
10,642,153 B2 5/2020 Meyers et al.
10,649,328 B2 5/2020 Stowers et al.
10,679,843 B2 6/2020 Jeong et al.
10,732,505 B1 8/2020 Meyers et al.
10,775,696 B2 9/2020 Meyers et al.
10,782,610 B2 9/2020 Stowers et al.
10,787,466 B2 9/2020 Edson et al.
10,815,391 B2 10/2020 Lee et al.
10,831,096 B2 11/2020 Marks et al.
11,079,682 B1 8/2021 Han et al.
11,209,729 B2 12/2021 Marks et al.
11,314,168 B2 4/2022 Tan et al.
11,462,417 B2 10/2022 Delmas et al.
11,988,965 B2 5/2024 Tan et al.
12,105,422 B2 10/2024 Tan et al.
12,183,604 B2 12/2024 Yu et al.
12,211,691 B2 1/2025 Volosskiy et al.
12,278,125 B2 4/2025 Yu et al.
12,346,035 B2 7/2025 Dictus et al.
2001/0055731 A1 12/2001 Irie
2002/0017243 A1 2/2002 Pyo
2003/0008246 A1 1/2003 Cheng et al.
2003/0027060 A1 2/2003 Lederer
2003/0134231 A1 7/2003 Tsai et al.
2003/0183244 A1 10/2003 Rossman
2004/0067444 A1 4/2004 Wakabayashi et al.
2004/0097388 A1 5/2004 Brask et al.
2004/0115956 A1 6/2004 Ishida
2004/0178076 A1 9/2004 Stonas et al.
2004/0191423 A1 9/2004 Ruan et al.
2004/0213563 A1 10/2004 Irie
2004/0229169 A1 11/2004 Sandstrom
2004/0233401 A1 11/2004 Irie
2005/0142885 A1 6/2005 Shinriki
2006/0001064 A1 1/2006 Hill et al.
2006/0046470 A1 3/2006 Becknell et al.
2006/0068173 A1 3/2006 Kajiyama et al.
2006/0151462 A1 7/2006 Lee et al.
2006/0166537 A1 7/2006 Thompson et al.
2006/0228897 A1* 10/2006 Timans ............ H01L 21/67115 438/758
2006/0287207 A1 12/2006 Park et al.
2007/0017386 A1 1/2007 Kamei
2007/0287073 A1 12/2007 Goodwin
2009/0134119 A1 5/2009 Matsumaru et al.
2009/0197086 A1 8/2009 Rathi et al.
2009/0325387 A1 12/2009 Chen et al.
2010/0009274 A1 1/2010 Yamamoto
2010/0068660 A1 3/2010 Shibazaki et al.
2010/0086880 A1 4/2010 Saito et al.
2010/0131093 A1 5/2010 Yokoyama et al.
2010/0216310 A1 8/2010 Metz et al.
2010/0310790 A1 12/2010 Chang et al.
2011/0117702 A1 5/2011 Rietzler et al.
2011/0195142 A1 8/2011 Mitamura et al.
2011/0198756 A1 8/2011 Thenappan et al.
2011/0200953 A1 8/2011 Arima et al.
2011/0209725 A1 9/2011 Kim et al.
2011/0242508 A1 10/2011 Kobayashi
2011/0244680 A1 10/2011 Tohnoe et al.
2011/0266252 A1 11/2011 Thadani et al.
2011/0277681 A1 11/2011 Arena et al.
2011/0292356 A1 12/2011 Tsukinoki et al.
2012/0088193 A1 4/2012 Weidman et al.
2012/0088369 A1 4/2012 Weidman et al.
2012/0090547 A1 4/2012 Wang et al.
2012/0202357 A1 8/2012 Sato et al.
2012/0208125 A1 8/2012 Hatakeyama
2012/0322011 A1 12/2012 Wu et al.
2013/0129995 A1 5/2013 Ouattara et al.
2013/0157177 A1 6/2013 Yu et al.
2013/0183609 A1 7/2013 Seon et al.
2013/0224652 A1 8/2013 Bass et al.
2013/0299089 A1 11/2013 Kim et al.
2013/0323652 A1 12/2013 Fernandez et al.
2013/0330928 A1 12/2013 Ishikawa et al.
2014/0014745 A1 1/2014 Burrows et al.
2014/0021673 A1 1/2014 Chen et al.

(56) References Cited

U.S. PATENT DOCUMENTS

| | | | |
|---|---|---|---|
| 2014/0209015 | A1 | 7/2014 | Yamada et al. |
| 2014/0255844 | A1 | 9/2014 | Iwao et al. |
| 2014/0263172 | A1 | 9/2014 | Xie et al. |
| 2014/0268082 | A1 | 9/2014 | Michaelson et al. |
| 2014/0272726 | A1 | 9/2014 | Chang |
| 2015/0020848 | A1 | 1/2015 | Kim et al. |
| 2015/0056542 | A1 | 2/2015 | Meyers et al. |
| 2015/0096683 | A1 | 4/2015 | Deshmukh et al. |
| 2015/0152551 | A1 | 6/2015 | Yamaguchi et al. |
| 2015/0221519 | A1 | 8/2015 | Marks et al. |
| 2015/0270148 | A1 | 9/2015 | Shinoda et al. |
| 2015/0303064 | A1 | 10/2015 | Singer et al. |
| 2015/0355549 | A1 | 12/2015 | Xie et al. |
| 2016/0011505 | A1 | 1/2016 | Stowers et al. |
| 2016/0011516 | A1 | 1/2016 | Devilliers |
| 2016/0021660 | A1 | 1/2016 | Krishnamurthy |
| 2016/0041471 | A1 | 2/2016 | Briend et al. |
| 2016/0086864 | A1 | 3/2016 | Fischer et al. |
| 2016/0116839 | A1 | 4/2016 | Meyers et al. |
| 2016/0126106 | A1 | 5/2016 | Shimizu et al. |
| 2016/0216606 | A1 | 7/2016 | Meyers et al. |
| 2016/0260588 | A1 | 9/2016 | Park et al. |
| 2016/0284559 | A1 | 9/2016 | Kikuchi et al. |
| 2016/0343544 | A1 | 11/2016 | Watanabe et al. |
| 2016/0357107 | A1 | 12/2016 | Buchberger, Jr. et al. |
| 2017/0004974 | A1 | 1/2017 | Manna et al. |
| 2017/0010535 | A1 | 1/2017 | Fujitani et al. |
| 2017/0018506 | A1 | 1/2017 | Cao et al. |
| 2017/0092495 | A1 | 3/2017 | Chen et al. |
| 2017/0097569 | A1 | 4/2017 | Yang et al. |
| 2017/0102612 | A1 | 4/2017 | Meyers et al. |
| 2017/0146909 | A1 | 5/2017 | Smith et al. |
| 2017/0154766 | A1 | 6/2017 | Ogihara et al. |
| 2017/0168398 | A1 | 6/2017 | Zi et al. |
| 2017/0176858 | A1 | 6/2017 | Hirano |
| 2017/0229325 | A1 | 8/2017 | Lubomirsky et al. |
| 2017/0261850 | A1 | 9/2017 | Stowers et al. |
| 2017/0342553 | A1 | 11/2017 | Yu et al. |
| 2018/0023192 | A1 | 1/2018 | Chandra et al. |
| 2018/0039172 | A1 | 2/2018 | Stowers et al. |
| 2018/0039182 | A1 | 2/2018 | Zi et al. |
| 2018/0046086 | A1 | 2/2018 | Waller et al. |
| 2018/0093306 | A1 | 4/2018 | Kang et al. |
| 2018/0122648 | A1 | 5/2018 | Kim et al. |
| 2018/0164689 | A1 | 6/2018 | Sano et al. |
| 2018/0166278 | A1 | 6/2018 | Belyansky et al. |
| 2018/0173096 | A1 | 6/2018 | Zi et al. |
| 2018/0224744 | A1 | 8/2018 | Bae et al. |
| 2018/0233362 | A1 | 8/2018 | Glodde et al. |
| 2018/0307137 | A1 | 10/2018 | Meyers et al. |
| 2018/0308687 | A1 | 10/2018 | Smith et al. |
| 2018/0314167 | A1 | 11/2018 | Chang et al. |
| 2018/0323064 | A1 | 11/2018 | Jung et al. |
| 2018/0354804 | A1 | 12/2018 | Venkatasubramanian et al. |
| 2018/0356731 | A1 | 12/2018 | Tagawa |
| 2019/0041755 | A1 | 2/2019 | Tanaka et al. |
| 2019/0129307 | A1 | 5/2019 | Kwon et al. |
| 2019/0131130 | A1 | 5/2019 | Smith et al. |
| 2019/0137870 | A1 | 5/2019 | Meyers et al. |
| 2019/0146337 | A1 | 5/2019 | Zi et al. |
| 2019/0153001 | A1 | 5/2019 | Cardineau et al. |
| 2019/0163056 | A1 | 5/2019 | Maes et al. |
| 2019/0172714 | A1 | 6/2019 | Bobek et al. |
| 2019/0187556 | A1 | 6/2019 | Park et al. |
| 2019/0244809 | A1 | 8/2019 | Ono |
| 2019/0259601 | A1 | 8/2019 | De Silva et al. |
| 2019/0308998 | A1 | 10/2019 | Cardineau et al. |
| 2019/0315781 | A1 | 10/2019 | Edson et al. |
| 2019/0315782 | A1 | 10/2019 | Edson et al. |
| 2019/0332014 | A1 | 10/2019 | Ookubo et al. |
| 2019/0333777 | A1 | 10/2019 | Hsieh et al. |
| 2019/0352776 | A1 | 11/2019 | Parikh |
| 2019/0369489 | A1 | 12/2019 | Meyers et al. |
| 2019/0378696 | A1 | 12/2019 | Addepalli et al. |
| 2019/0391486 | A1 | 12/2019 | Jiang et al. |
| 2020/0041897 | A1 | 2/2020 | Moon et al. |
| 2020/0041901 | A1 | 2/2020 | Namgung et al. |
| 2020/0064733 | A1 | 2/2020 | Meyers et al. |
| 2020/0066536 | A1 | 2/2020 | Yaegashi |
| 2020/0089104 | A1 | 3/2020 | Marks et al. |
| 2020/0124970 | A1 | 4/2020 | Kocsis et al. |
| 2020/0133133 | A1 | 4/2020 | Park et al. |
| 2020/0166845 | A1 | 5/2020 | Berendsen et al. |
| 2020/0174374 | A1 | 6/2020 | Liao et al. |
| 2020/0176246 | A1 | 6/2020 | Huotari et al. |
| 2020/0209756 | A1 | 7/2020 | Waller et al. |
| 2020/0239498 | A1 | 7/2020 | Clark et al. |
| 2020/0241413 | A1 | 7/2020 | Clark et al. |
| 2020/0257196 | A1 | 8/2020 | Meyers et al. |
| 2020/0292937 | A1 | 9/2020 | Stowers et al. |
| 2020/0326627 | A1 | 10/2020 | Jiang et al. |
| 2020/0393765 | A1 | 12/2020 | Sakanishi |
| 2021/0013034 | A1 | 1/2021 | Wu et al. |
| 2021/0271170 | A1 | 9/2021 | Telecky et al. |
| 2021/0287909 | A1 | 9/2021 | Zhou et al. |
| 2021/0302833 | A1 | 9/2021 | Weng et al. |
| 2021/0305040 | A1 | 9/2021 | Kuo et al. |
| 2021/0397085 | A1 | 12/2021 | Weidman et al. |
| 2022/0002882 | A1 | 1/2022 | Kalutarage et al. |
| 2022/0020584 | A1 | 1/2022 | Volosskiy et al. |
| 2022/0028684 | A1 | 1/2022 | Chen et al. |
| 2022/0035247 | A1 | 2/2022 | Tan et al. |
| 2022/0043334 | A1 | 2/2022 | Tan et al. |
| 2022/0059362 | A1 | 2/2022 | Li et al. |
| 2022/0075260 | A1 | 3/2022 | Marks et al. |
| 2022/0244645 | A1 | 8/2022 | Tan et al. |
| 2022/0299877 | A1 | 9/2022 | Weidman et al. |
| 2022/0308454 | A1 | 9/2022 | Weidman et al. |
| 2022/0308462 | A1 | 9/2022 | Berney et al. |
| 2022/0342301 | A1 | 10/2022 | Weidman et al. |
| 2022/0344136 | A1 | 10/2022 | Peter et al. |
| 2022/0359280 | A1 | 11/2022 | Yang et al. |
| 2022/0365434 | A1 | 11/2022 | Nardi et al. |
| 2022/0404713 | A1 | 12/2022 | Tapily |
| 2023/0031955 | A1 | 2/2023 | Yu et al. |
| 2023/0045336 | A1 | 2/2023 | Yu et al. |
| 2023/0078946 | A1 | 3/2023 | Grzeskowiak et al. |
| 2023/0100995 | A1 | 3/2023 | Cardineau et al. |
| 2023/0107357 | A1 | 4/2023 | Dictus et al. |
| 2023/0126516 | A1 | 4/2023 | Wang et al. |
| 2023/0152701 | A1 | 5/2023 | Kanakasabapathy |
| 2023/0259025 | A1 | 8/2023 | Hansen et al. |
| 2023/0266662 | A1 | 8/2023 | Marks et al. |
| 2023/0266664 | A1 | 8/2023 | Hansen et al. |
| 2023/0266670 | A1 | 8/2023 | Hansen et al. |
| 2023/0273516 | A1 | 8/2023 | Marks et al. |
| 2023/0288798 | A1 | 9/2023 | Hansen et al. |
| 2023/0290657 | A1 | 9/2023 | Yu et al. |
| 2023/0314946 | A1 | 10/2023 | Hansen et al. |
| 2023/0314954 | A1 | 10/2023 | Peter et al. |
| 2023/0341781 | A1 | 10/2023 | Han et al. |
| 2023/0416606 | A1 | 12/2023 | Dictus et al. |
| 2024/0027900 | A1 | 1/2024 | Hajibabaeinajafabadi et al. |
| 2024/0036473 | A1 | 2/2024 | Fujimoto et al. |
| 2024/0036483 | A1 | 2/2024 | Dictus et al. |
| 2024/0045337 | A1 | 2/2024 | Hajibabaeinajafabadi et al. |
| 2024/0053684 | A1 | 2/2024 | Hajibabaeinajafabadi et al. |
| 2024/0145272 | A1 | 5/2024 | Yu et al. |
| 2024/0329538 | A1 | 10/2024 | Li et al. |
| 2024/0355650 | A1 | 10/2024 | Kanakasabapathy et al. |
| 2024/0419078 | A1 | 12/2024 | Tan et al. |
| 2025/0053080 | A1 | 2/2025 | Marks et al. |
| 2025/0053084 | A1 | 2/2025 | Hansen et al. |
| 2025/0053092 | A1 | 2/2025 | Kenane et al. |
| 2025/0060673 | A1 | 2/2025 | Wu et al. |
| 2025/0060674 | A1 | 2/2025 | Li et al. |
| 2025/0093781 | A1 | 3/2025 | Peter et al. |
| 2025/0112045 | A1 | 4/2025 | Volosskiy et al. |
| 2025/0244672 | A1 | 7/2025 | Weidman et al. |
| 2025/0244677 | A1 | 7/2025 | Li et al. |
| 2025/0244678 | A1 | 7/2025 | Lee et al. |
| 2025/0246460 | A1 | 7/2025 | Yu et al. |
| 2025/0250485 | A1 | 8/2025 | Dictus et al. |

(56) References Cited

U.S. PATENT DOCUMENTS

| | | | |
|---|---|---|---|
| 2025/0271766 | A1 | 8/2025 | Hansen et al. |
| 2025/0271782 | A1 | 8/2025 | Dictus et al. |
| 2025/0291255 | A1 | 9/2025 | Lee et al. |

FOREIGN PATENT DOCUMENTS

| | | | |
|---|---|---|---|
| CN | 102610516 | A | 7/2012 |
| CN | 105047541 | A | 11/2015 |
| CN | 105579906 | A | 5/2016 |
| CN | 106876251 | A | 6/2017 |
| CN | 108351594 | A | 7/2018 |
| CN | 108388079 | A | 8/2018 |
| CN | 108780739 | A | 11/2018 |
| CN | 109521657 | A | 3/2019 |
| CN | 109976097 | A | 7/2019 |
| CN | 110609441 | A | 12/2019 |
| CN | 111254416 | A | 6/2020 |
| CN | 111258190 | A | 6/2020 |
| EP | 0197286 | A2 | 10/1986 |
| EP | 0197286 | B1 | 9/1991 |
| EP | 0465064 | A2 | 1/1992 |
| EP | 1123423 | B1 | 8/2007 |
| EP | 3230294 | A1 | 10/2017 |
| JP | S5119974 | A | 2/1976 |
| JP | S57205736 | A | 12/1982 |
| JP | S5883847 | A | 5/1983 |
| JP | S58108744 | A | 6/1983 |
| JP | S6112653 | U | 1/1986 |
| JP | S61234035 | A | 10/1986 |
| JP | H04226462 | A | 8/1992 |
| JP | H0637050 | A | 2/1994 |
| JP | H06169021 | A | 6/1994 |
| JP | H06232041 | A | 8/1994 |
| JP | H07106224 | A | 4/1995 |
| JP | H07161607 | A | 6/1995 |
| JP | H07244386 | A | 9/1995 |
| JP | H0869959 | A | 3/1996 |
| JP | H08316237 | A | 11/1996 |
| JP | H08339950 | A | 12/1996 |
| JP | H09172022 | A | 6/1997 |
| JP | H1041206 | A | 2/1998 |
| JP | H10209133 | A | 8/1998 |
| JP | H10301298 | A | 11/1998 |
| JP | H11119440 | A | 4/1999 |
| JP | 2000305273 | A | 11/2000 |
| JP | 2000347413 | A | 12/2000 |
| JP | 2000356857 | A | 12/2000 |
| JP | 2002100558 | A | 4/2002 |
| JP | 2002118096 | A | 4/2002 |
| JP | 2003131364 | A | 5/2003 |
| JP | 2003280155 | A | 10/2003 |
| JP | 2004510321 | A | 4/2004 |
| JP | 2004513515 | A | 4/2004 |
| JP | 2004259786 | A | 9/2004 |
| JP | 2005260015 | A | 9/2005 |
| JP | 2006310681 | A | 11/2006 |
| JP | 2007027617 | A | 2/2007 |
| JP | 2009192350 | A | 8/2009 |
| JP | 2009212404 | A | 9/2009 |
| JP | 2010016314 | A | 1/2010 |
| JP | 2010500762 | A | 1/2010 |
| JP | 2010067979 | A | 3/2010 |
| JP | 2010123732 | A | 6/2010 |
| JP | 2010531931 | A | 9/2010 |
| JP | 2010239087 | A | 10/2010 |
| JP | 2012142481 | A | 7/2012 |
| JP | 2012173315 | A | 9/2012 |
| JP | 5055743 | B2 | 10/2012 |
| JP | 2012191242 | A | 10/2012 |
| JP | 2013033291 | A | 2/2013 |
| JP | 2013047848 | A | 3/2013 |
| JP | 2013096011 | A | 5/2013 |
| JP | 2013542944 | A | 11/2013 |
| JP | 2014504004 | A | 2/2014 |
| JP | 5544914 | B2 | 7/2014 |
| JP | 2015504604 | A | 2/2015 |
| JP | 5705103 | B2 | 4/2015 |
| JP | 2015106640 | A | 6/2015 |
| JP | 2016072557 | A | 5/2016 |
| JP | 2016530565 | A | 9/2016 |
| JP | 2017045869 | A | 3/2017 |
| JP | 2017108053 | A | 6/2017 |
| JP | 2017116923 | A | 6/2017 |
| JP | 2017152689 | A | 8/2017 |
| JP | 2017532407 | A | 11/2017 |
| JP | 2018502173 | A | 1/2018 |
| JP | 2018518688 | A | 7/2018 |
| JP | 2018164076 | A | 10/2018 |
| JP | 2018200930 | A | 12/2018 |
| JP | 2019500490 | A | 1/2019 |
| JP | 2019024129 | A | 2/2019 |
| JP | 2019506730 | A | 3/2019 |
| JP | 2019056730 | A | 4/2019 |
| JP | 2019135755 | A | 8/2019 |
| JP | 2019192814 | A | 10/2019 |
| JP | 2019532182 | A | 11/2019 |
| JP | 2021523403 | A | 9/2021 |
| JP | 2022502714 | A | 1/2022 |
| KR | 890015374 | A | 10/1989 |
| KR | 900001238 | B1 | 3/1990 |
| KR | 950001406 | A | 1/1995 |
| KR | 960000375 | B1 | 1/1996 |
| KR | 19990029141 | A | 4/1999 |
| KR | 19990070327 | A | 9/1999 |
| KR | 20000073111 | A | 12/2000 |
| KR | 20020000292 | A | 1/2002 |
| KR | 20050112115 | A | 11/2005 |
| KR | 100575847 | B1 | 5/2006 |
| KR | 20070003657 | A | 1/2007 |
| KR | 20080046577 | A | 5/2008 |
| KR | 20100090643 | A | 8/2010 |
| KR | 20110007192 | A | 1/2011 |
| KR | 20110009739 | A | 1/2011 |
| KR | 20120078672 | A | 7/2012 |
| KR | 20120093781 | A | 8/2012 |
| KR | 20130007389 | A | 1/2013 |
| KR | 20140047120 | A | 4/2014 |
| KR | 101426105 | B1 | 8/2014 |
| KR | 20140106442 | A | 9/2014 |
| KR | 20140109816 | A | 9/2014 |
| KR | 20150008065 | A | 1/2015 |
| KR | 20150091260 | A | 8/2015 |
| KR | 20150127145 | A | 11/2015 |
| KR | 20150129781 | A | 11/2015 |
| KR | 20150143480 | A | 12/2015 |
| KR | 20160035995 | A | 4/2016 |
| KR | 20160082969 | A | 7/2016 |
| KR | 20170066218 | A | 6/2017 |
| KR | 20180036263 | A | 4/2018 |
| KR | 20180054917 | A | 5/2018 |
| KR | 20180116438 | A | 10/2018 |
| KR | 20180119471 | A | 11/2018 |
| KR | 20210015639 | A | 2/2021 |
| KR | 20210142118 | A | 11/2021 |
| KR | 20220025020 | A | 3/2022 |
| KR | 20220130783 | A | 9/2022 |
| KR | 20230029977 | A | 3/2023 |
| TW | 200504864 | A | 2/2005 |
| TW | 200846333 | A | 12/2008 |
| TW | 200903686 | A | 1/2009 |
| TW | 200947117 | A | 11/2009 |
| TW | 201005568 | A | 2/2010 |
| TW | 201145383 | A | 12/2011 |
| TW | 201224190 | A | 6/2012 |
| TW | I365354 | B | 6/2012 |
| TW | 201241555 | A | 10/2012 |
| TW | 201245918 | A | 11/2012 |
| TW | 201246273 | A | 11/2012 |
| TW | 201501179 | A | 1/2015 |
| TW | I494689 | B | 8/2015 |
| TW | 201631377 | A | 9/2016 |
| TW | 201729006 | A | 8/2017 |
| TW | 201734025 | A | 10/2017 |
| TW | 201826034 | A | 7/2018 |

(56) References Cited

FOREIGN PATENT DOCUMENTS

| | | | |
|---|---|---|---|
| TW | 201830472 | A | 8/2018 |
| TW | 201837066 | A | 10/2018 |
| TW | 201931011 | A | 8/2019 |
| TW | 202001407 | A | 1/2020 |
| TW | 202006168 | A | 2/2020 |
| WO | WO-2004095551 | A1 | 11/2004 |
| WO | WO-2007123539 | A1 | 11/2007 |
| WO | WO-2008019362 | A2 | 2/2008 |
| WO | WO-2008088076 | A1 | 7/2008 |
| WO | WO-2011081151 | A1 | 7/2011 |
| WO | WO-2012075249 | A1 | 6/2012 |
| WO | WO-2012048094 | A3 | 7/2012 |
| WO | WO-2013078211 | A1 | 5/2013 |
| WO | WO-2014172142 | A1 | 10/2014 |
| WO | WO-2016065120 | A1 | 4/2016 |
| WO | WO-2016144960 | A1 | 9/2016 |
| WO | WO-2016208300 | A1 | 12/2016 |
| WO | WO-2017002497 | A1 | 1/2017 |
| WO | WO-2017066319 | A2 | 4/2017 |
| WO | WO-2017109040 | A1 | 6/2017 |
| WO | WO-2017198418 | A1 | 11/2017 |
| WO | WO-2018004551 | A1 | 1/2018 |
| WO | WO-2018004646 | A1 | 1/2018 |
| WO | WO-2018061670 | A1 | 4/2018 |
| WO | WO-2018189413 | A1 | 10/2018 |
| WO | WO-2019163455 | A1 | 8/2019 |
| WO | WO-2019217749 | A1 | 11/2019 |
| WO | WO-2019222320 | A1 | 11/2019 |
| WO | WO-2019241402 | A1 | 12/2019 |
| WO | WO-2020014179 | A1 | 1/2020 |
| WO | WO-2020030855 | A2 | 2/2020 |
| WO | WO-2020102085 | A1 | 5/2020 |
| WO | WO-2020132281 | A1 | 6/2020 |
| WO | WO-2020190941 | A1 | 9/2020 |
| WO | WO-2020263750 | A1 | 12/2020 |
| WO | WO-2020264158 | A1 | 12/2020 |
| WO | WO-2020264571 | A1 | 12/2020 |
| WO | WO-2021072042 | A1 | 4/2021 |
| WO | WO-2021202681 | A1 | 10/2021 |
| WO | WO-2021262529 | A1 | 12/2021 |
| WO | WO-2022005808 | A1 | 1/2022 |
| WO | WO-2022103764 | A1 | 5/2022 |
| WO | WO-2022103949 | A1 | 5/2022 |
| WO | WO-2022125388 | A1 | 6/2022 |

OTHER PUBLICATIONS

International Preliminary Report on Patentability and Written Opinion dated Nov. 14, 2024 in PCT Application No. PCT/US2023/019871.
International Search Report and Written Opinion dated Nov. 20, 2024 in PCT Application No. PCT/US2024/039915.
JP Office Action dated Nov. 12, 2024 in JP Application No. 2024-522188 with English translation.
KR Notice of Allowances dated Oct. 16, 2024 in KR Application No. 10-2022-7002869 with English Translation.
KR Office Action dated Nov. 28, 2024 in KR Application No. 10-2022-7014896, with English Translation.
TW Office Action dated Nov. 26, 2024 in TW Application No. 110126445, with English Translation.
U.S. Corrected Notice of Allowance dated Nov. 21, 2024 in U.S. Appl. No. 17/309,587.
U.S. Non-Final Office Action dated Oct. 1, 2024 in U.S. Appl. No. 17/309,587.
U.S. Non-Final Office Action dated Oct. 9, 2024 in U.S. Appl. No. 18/377,245.
U.S. Notice of Allowance dated Nov. 14, 2024 in U.S. Appl. No. 17/309,587.
U.S. Appl. No. 18/855,026, inventors Lee Y, et al., filed Oct. 8, 2024.
U.S. Appl. No. 18/932,475, inventors Marks J, et al., filed Oct. 30, 2024.
U.S. Restriction requirement dated Nov. 14, 2024 in U.S. Appl. No. 18/700,238.
U.S. Restriction requirement dated Oct. 30, 2024 in U.S. Appl. No. 18/769,038.
U.S. Supplemental Notice of Allowance dated Nov. 15, 2024 in U.S. Appl. No. 18/184,545.
Cardineau, B. et al., "EUV Resists Based on Tin-oxo Clusters", Advances in Patterning Materials and Processes XXXI, Proceedings of SPIE, Apr. 4, 2014, vol. 9051, pp. 335-346.
CN Office Action dated Apr. 22, 2024 in CN Application No. 201980085227.1 with English translation.
CN Office Action dated Dec. 13, 2023 in CN Application No. 201810783756.6 with English translation.
CN Office Action dated Jan. 3, 2024 in CN Application No. 202310318757.4 with English Translation.
CN Office Action dated Jan. 23, 2024 in CN Application No. 202080046943.1 with English Translation.
CN Office Action dated Jul. 23, 2024 in CN Application No. 201810783756.6 with English translation.
CN Office Action dated Jun. 1, 2023, in application No. CN201810783756 with English translation.
CN Office Action dated Jun. 8, 2022 in Application No. CN202180002531.2 With English Translation.
CN Office Action dated Mar. 14, 2024 in CN Application No. 201810783756.6, with English Translation.
CN Office Action dated Nov. 16, 2022, in Application No. CN202180002531.2 with English translation.
CN Office Action dated Nov. 18, 2022, in Application No. CN201810783756.6 with English Translation.
CN Office Action dated Sep. 14, 2024 in CN Application No. 202310318757.4 with English translation.
CN Office Action dated Sep. 23, 2024 in CN Application No. 202080046943.1 with English translation.
Dahuang, D., et al., Functional Thin Films and Their Deposition Preparation Techniques, Metallurgy Industrial Press, Jan. 31, 2013, pp. 450-454. [with English Translation].
Danilo D.E., et al., "Metal Containing Resist Readiness for HVM EUV Lithography", Journal of Photopolymer Science and Technology, 2016, vol. 29(3), pp. 501-507.
EP Extended European Search Report dated Jul. 13, 2023, in Application No. EP20831843.6.
EP Extended European Search report dated Nov. 29, 2023 in EP Application No. 23173688.5.
EP Extended European Search report dated Oct. 25, 2023, in Application No. EP21837274.6.
EP Partial European Search Report dated Aug. 29, 2023, in Application No. 23173688.5.
European Search Report dated Feb. 15, 2022, in Application No. EP21741104.
European Office Action dated Feb. 25, 2022 in Application No. 21741104.
Extended European Search Report dated Dec. 23, 2021, in Application No. EP19800353.5.
Hamley, I.W., "Nanostructure fabrication using block copolymers", Nanotechnology. Sep. 17, 2003;14(10):R39-R54.
Hench, L.L. and West, J.K., "The sol-gel process," Chemical reviews, Jan. 1, 1990; 90(1) pp. 33-72.
International Preliminary Report on Patentability dated Oct. 13, 2022, in PCT Application No. PCT/US2021/023493.
International Search Report and Written Opinion dated Aug. 4, 2021, in PCT Application No. PCT/US2021/023493.
International Search Report and Written Opinion dated Mar. 4, 2022, in Application No. PCT/US2021/058647.
International Preliminary Report on Patentability dated May 27, 2021 issued in Application No. PCT/US2019/060742.
International Search Report and Written Opinion dated May 17, 2021 issued in Application No. PCT/US2021/015656.
International Preliminary Report on Patentability and Written Opinion dated Dec. 28, 2023 in PCT Application No. PCT/US2022/033488.
International Preliminary Report on Patentability and Written Opinion dated Feb. 8, 2024 in PCT Application No. PCT/US2022/037733.

(56) References Cited

OTHER PUBLICATIONS

International Preliminary Report on Patentability and Written Opinion dated Jun. 27, 2024 in PCT Application No. PCT/US2022/081376.
International Preliminary Report on Patentability and Written Opinion dated Jun. 27, 2024 in PCT Application No. PCT/US2022/081390.
International Preliminary Report on Patentability and Written Opinion dated Jun. 27, 2024 in PCT Application No. PCT/US2022/081845.
International Preliminary Report on Patentability dated Apr. 14, 2022 issued in Application No. PCT/US2020/053856.
International Preliminary Report on Patentability dated Aug. 18, 2022 in PCT Application No. PCT/US2021/015656.
International Preliminary Report on Patentability dated Jan. 27, 2021 in Application PCT/US2020/054730.
International Preliminary Report on Patentability dated Jan. 5, 2023 in PCT Application No. PCT/US2021/034019.
International Preliminary Report on Patentability dated Jan. 5, 2023 in PCT Application No. PCT/US2021/037924.
International Preliminary Report on Patentability dated Jan. 19, 2023 in PCT Application No. PCT/US2021/040381.
International Preliminary Report on Patentability dated Jan. 26, 2023 in PCT Application No. PCT/US2021/042106.
International Preliminary Report on Patentability dated Jan. 6, 2022 in PCT Application No. PCT/US2020/038968.
International Preliminary Report on Patentability dated Jan. 6, 2022 in PCT Application No. PCT/US2020/039615.
International Preliminary Report on Patentability dated Jan. 6, 2022 in PCT Application No. PCT/US2020/070171.
International Preliminary Report on Patentability dated Jan. 6, 2022 in PCT Application No. PCT/US2020/070172.
International Preliminary Report on Patentability dated Jan. 6, 2022 in PCT Application No. PCT/US2020/070187.
International Preliminary Report on Patentability dated Jul. 28, 2022 in PCT Application No. PCT/US2021/012953.
International Preliminary Report on Patentability dated Jun. 22, 2023, in Application No. PCT/US2021/061751.
International Preliminary Report on Patentability dated May 25, 2023, in Application No. PCT/US2021/058647.
International Search Report and Written Opinion dated May 12, 2021 issued in Application No. PCT/US2021/012953.
International Search Report and Written Opinion dated Apr. 10, 2020 issued in Application No. PCT/US2019/060742.
International Search Report and Written Opinion dated Apr. 17, 2023, in Application No. PCT/US2022/081390.
International Search Report and Written Opinion dated Apr. 17, 2023 in PCT Application No. PCT/US2022/081376.
International Search Report and Written Opinion dated Apr. 19, 2023, in Application No. PCT/US2022/081845.
International Search Report and Written Opinion dated Apr. 24, 2020 issued in Application No. PCT/US2019/067540.
International Search Report and Written Opinion dated Aug. 17, 2023, in Application No. PCT/US2023/019871.
International Search Report and Written Opinion dated Aug. 22, 2019 issued in Application No. PCT/US2019/031618.
International Search Report and Written Opinion dated Jan. 27, 2021 issued in Application No. PCT/US2020/054730.
International Search Report and Written Opinion dated Jul. 4, 2024 in PCT Application No. PCT/US2024/019555.
International Search Report and Written Opinion dated Mar. 23, 2021 issued in Application No. PCT/US2020/053856.
International Search Report and Written Opinion dated Mar. 24, 2022, for International Application No. PCT/US2021/061751.
International Search Report and Written Opinion dated Nov. 4, 2021 in PCT Application No. PCT/US2021/042106.
International Search Report and Written Opinion dated Nov. 11, 2022 in PCT Application No. PCT/US2022/037733.
International Search Report and Written Opinion dated Oct. 8, 2020 in Application No. PCT/US2020/038968.
International Search Report and Written Opinion dated Oct. 13, 2021, in application No. PCT/US2021/037924.
International Search Report and Written Opinion dated Oct. 13, 2023 in PCT Application No. PCT/US2023/069419.
International Search Report and Written Opinion dated Oct. 16, 2020 issued in Application No. PCT/US2020/039615.
International Search Report and Written Opinion dated Oct. 16, 2020 issued in Application No. PCT/US2020/070171.
International Search Report and Written Opinion dated Oct. 16, 2020 issued in Application No. PCT/US2020/070172.
International Search Report and Written Opinion dated Oct. 17, 2022 in PCT Application No. PCT/US2022/033488.
International Search Report and Written Opinion dated Oct. 28, 2021 in PCT Application No. PCT/US2021/040381.
International Search Report and Written Opinion dated Oct. 8, 2020 issued in Application No. PCT/US2020/038968.
International Search Report and Written Opinion dated Sep. 15, 2021, in PCT Application No. PCT/US2021/034019.
JP Office Action dated Jul. 26, 2022 in Application No. JP2021102822 With English translation.
JP Office Action dated Nov. 15, 2022, in Application No. JP2021-176082 with English translation.
JP Notice of Allowances dated Aug. 27, 2024 in JP Application No. 2022-559416 with English translation.
JP Notice of Allowances dated Sep. 3, 2024 in JP Application No. 2023-63868 with English translation.
JP Office Action dated Apr. 2, 2024 in JP Application No. 2022-559416, with English Translation.
JP Office Action dated Apr. 27, 2023 in Application No. JP2021-575910 with English translation.
JP Office Action dated Feb. 13, 2024 in JP Application No. 2023-63868, with English Translation.
JP Office Action dated Jan. 9, 2024 in JP Application No. 2023-179933, with English Translation.
JP Office Action dated Jan. 9, 2024 in JP Application No. 2023-184334 with English Translation.
JP Office Action dated Jan. 17, 2023, in Application No. JP2022-552422 with English translation.
JP Office Action dated Jun. 27, 2023, in Application No. JP2022-552422 with English translation.
JP Office Action dated Jun. 27, 2023, in application No. JP2023-63868 with English translation.
JP Office Action dated Mar. 5, 2024 in JP Application No. 2021-575910, with English Translation.
JP Office Action dated Nov. 14, 2023, in JP Application No. 2021-0575910 with English Translation.
JP Office Action dated Nov. 14, 2023 in JP Application No. 2022-559416, with English Translation.
JP Office Action dated Oct. 10, 2023 in Application No. JP2022-552422 with English Translation.
KR Notice of Allowance dated Aug. 1, 2024 in KR Application No. 10-2024-7012307, with English Translation.
KR Office Action dated Feb. 8, 2022, in Application No. KR10-2021-7030794 with English Translation.
KR Office Action dated Apr. 9, 2024 in KR Application No. 10-2023-7038357 with English Translation.
KR Office Action dated Apr. 23, 2024 in KR Application No. 10-2016-0152489 with English translation.
KR Office Action dated Aug. 11, 2023, in Application No. KR10-2023-7011840 with English translation.
KR Office Action dated Feb. 29, 2024 in KR Application No. 10-2022-7026649, with English Translation.
KR Office Action dated Jul. 12, 2024 in KR Application No. 10-2022-7029421 with English translation.
KR Office Action dated Jul. 12, 2024 in KR Application No. 10-2023-7036296 with English translation.
KR Office Action dated Jun. 24, 2024 in KR Application No. 10-2022-7002869, with English Translation.
KR Office Action dated Mar. 14, 2024 in KR Application No. 10-2021-7022858, with English Translation.
KR Office Action dated May 9, 2022, in Application No. KR1020217030794 with English translation.

(56) References Cited

OTHER PUBLICATIONS

KR Office Action dated Nov. 21, 2023 in KR Application No. 10-2022-7002869 with English Translation.
KR Office Action dated Nov. 21, 2023 in KR Application No. 10-2022-7029421 with English Translation.
Kwon, J., et al., "Substrate Selectivity of (tBu-Allyl)Co(C0)3 during Thermal Atomic Layer Deposition of Cobalt," Chemistry of Materials, Mar. 27, 2012; 24(6): pp. 1025-1030.
Lemaire, P.C., et al., "Understanding inherent substrate selectivity during atomic layer deposition: Effect of surface preparation, hydroxyl density, and metal oxide composition on nucleation mechanisms during tungsten ALD" The Journal of chemical physics, Feb. 7, 2017, 146(5):052811.
Lu, Y., et al., "Continuous formation of supported cubic and hexagonal mesoporous films by sol-gel dip-coating" Nature, Sep. 1997, 389(6649), pp. 364-368.
Mackus, A.J., et al. "The use of atomic layer deposition in advanced nanopatterning", Nanoscale. Jul. 25, 2014; 6(19):10941-60.
Nazarov, D.V., et al., "Atomic layer deposition of tin dioxide nanofilms: A review", Rev. Adv. Mater. Sci. Jun. 1, 2015; 40(3):262-75.
Notice of Allowance dated Dec. 9, 2021 in U.S. Appl. No. 17/310,635.
Rantala, et al., "New resist and underlayer approaches toward EUV lithography," Proc. SPIE 10809, International Conference on Extreme Ultraviolet Lithography 2018, pp. 108090X-1-108090X-8. (Oct. 11, 2018).
SG Written Opinion dated Aug. 30, 2024 in SG Application No. 11202114183P.
TW Office Action dated Jan. 9, 2023 in Application No. TW20190116155 with English translation.
TW Office Action dated Sep. 5, 2022, in Application No. TW110101388 with English translation.
TW Office Action dated Apr. 19, 2024 in TW Application No. 112146727 with English translation.
TW Office Action dated Apr. 22, 2024 in TW Application No. 112126160 with English translation.
TW Office Action dated Apr. 29, 2022 in Application No. TW110118172 with English translation.
TW Office Action dated Aug. 17, 2023, in application No. TW110124741 with Translation.
TW Office Action dated Jan. 11, 2024 in TW Application No. 108146890, with English Translation.
TW Office Action dated Jan. 13, 2023, in Application No. TW110124741 with English translation.
TW Office Action dated Jan. 19, 2023 in Application No. TW110141961 with English translation.
TW Office Action dated Jul. 2, 2024 in TW Application No. 109134940 with English translation.
TW Office Action dated Jul. 9, 2024 in TW Application No. 110111086 with English translation.
TW Office Action dated Jun. 27, 2024 in TW Application No. 113107490 with English translation.
TW Office Action dated Mar. 21, 2024 in TW Application No. 108146890, with English Translation.
TW Office Action dated Mar. 7, 2022, in Application No. TW110101388 with English translation.
TW Office Action dated May 16, 2023, in Application No. TW20190146890 with English translation.
TW Office Action dated Oct. 13, 2023, in application No. TW109121680 with English Translation.
U.S. Advisory Action dated Apr. 16, 2024 in U.S. Appl. No. 17/596,648.
U.S. Advisory Action dated Jun. 24, 2024 in U.S. Appl. No. 18/377,245.
U.S. Advisory Action dated May 7, 2024 in U.S. Appl. No. 18/298,003.
U.S. Advisory Action dated Sep. 3, 2024 in U.S. Appl. No. 18/377,267.
U.S. Advisory Action dated Sep. 5, 2024 in U.S. Appl. No. 17/759,281.
U.S. Corrected Notice of Allowance dated Aug. 29, 2024 in U.S. Appl. No. 17/596,648.
U.S. Final Office Action dated Feb. 27, 2024 in U.S. Appl. No. 18/298,003.
U.S. Final Office Action dated Jun. 21, 2024 in U.S. Appl. No. 18/377,267.
U.S. Final Office Action dated Jun. 27, 2024 in U.S. Appl. No. 17/759,281.
U.S. Final Office Action dated Mar. 5, 2024 in U.S. Appl. No. 17/596,648.
U.S. Final Office Action dated Mar. 12, 2024 in U.S. Appl. No. 18/377,245.
U.S. Final Office Action dated May 3, 2024 in U.S. Appl. No. 18/297,989.
U.S. Final Office Action dated May 9, 2024 in U.S. Appl. No. 17/309,587.
U.S. Final Office Action dated May 12, 2023 in U.S. Appl. No. 17/455,185.
U.S. Final Office Action dated Nov. 9, 2023 in U.S. Appl. No. 17/455,185.
U.S. Non-Final Office Action dated Feb. 1, 2024 in U.S. Appl. No. 17/759,281.
U.S. Non-Final office Action dated Feb. 7, 2023 in U.S. Appl. No. 17/455,185.
U.S. Non-Final Office Action dated Jun. 21, 2024 in U.S. Appl. No. 17/596,648.
U.S. Non-Final Office Action dated Mar. 4, 2024 in U.S. Appl. No. 17/758,125.
U.S. Non-Final Office Action dated Mar. 4, 2024 in U.S. Appl. No. 18/377,267.
U.S. Non-Final Office Action dated May 29, 2024 in U.S. Appl. No. 18/298,003.
U.S. Non-Final Office Action dated Nov. 6, 2023, in U.S. Appl. No. 17/309,587.
U.S. Non-Final Office Action dated Nov. 20, 2023 in U.S. Appl. No. 18/377,245.
U.S. Non-Final Office Action dated Oct. 13, 2023, in U.S. Appl. No. 18/184,545.
U.S. Non-Final Office Action dated Oct. 20, 2023, in U.S. Appl. No. 18/297,989.
U.S. Non-Final Office Action dated Oct. 20, 2023, in U.S. Appl. No. 18/298,003.
U.S. Non-Final Office Action dated Oct. 26, 2023, in U.S. Appl. No. 17/596,648.
U.S. Notice of Allowance dated Aug. 7, 2024 in U.S. Appl. No. 18/184,545.
U.S. Notice of Allowance dated Aug. 16, 2024 in U.S. Appl. No. 17/596,648.
U.S. Notice of Allowance dated Feb. 22, 2022 in U.S. Appl. No. 17/310,635.
U.S. Notice of Allowance dated Mar. 6, 2024 in U.S. Appl. No. 18/184,545.
U.S. Notice of Allowance dated Mar. 13, 2024 in U.S. Appl. No. 18/184,545.
U.S. Notice of Allowance dated Sep. 9, 2024 in U.S. Appl. No. 18/184,545.
US Notice of Allowance dated Sep. 15, 2021, issued in U.S. Appl. No. 16/691,508.
US Notice of Allowance dated Sep. 9, 2021, issued in U.S. Appl. No. 16/691,508.
U.S. Appl. No. 18/569,213, inventors Kanakasabapathy S K, et al., filed Dec. 11, 2023.
U.S. Appl. No. 18/850,628, inventors Li D, et al., filed Sep. 25, 2024.
U.S. Appl. No. 18/850,990, inventors Lee Y, et al., filed Sep. 25, 2024.
U.S. Restriction Requirement dated Nov. 14, 2022 in U.S. Appl. No. 17/455,185.
U.S. Restriction requirement dated Aug. 4, 2023, in U.S. Appl. No. 18/297,989.
U.S Restriction requirement dated Aug. 18, 2023 in U.S. Appl. No. 18/298,003.
U.S. Restriction requirement dated Aug. 30, 2024 in U.S. Appl. No. 18/700,238.

(56) References Cited

OTHER PUBLICATIONS

U.S. Restriction Requirement dated Nov. 20, 2023 in U.S. Appl. No. 17/759,281.
U.S. Restriction requirement dated Sep. 7, 2023 in U.S. Appl. No. 17/309,587.
Xu, et al., "Underlayer designs to enhance the performance of EUV resists," Proceedings of SPIE, vol. 7273, 2009, pp. 727311-1-727311-11.
EP Office Action dated Jan. 21, 2025 in EP Application No. 23173688.5.
International Search Report and Written Opinion dated Dec. 26, 2024 in PCT Application No. PCT/US2024/046887.
International Search Report and Written Opinion dated Feb. 21, 2025 in PCT Application No. PCT/US2024/054953.
International Search Report and Written Opinion dated Sep. 13, 2024 in PCT Application No. PCT/US2024/033522.
JP Office Action dated Jan. 7, 2025 in JP Application No. 2023-533602, with English Translation.
KR Notice of Allowance dated Dec. 12, 2024 in KR Application No. 10-2016-0152489, with English Translation.
KR Notice of Allowance dated Jan. 23, 2025 in KR Application No. 10-2024-7037880, with English Translation.
KR Office Action dated Feb. 5, 2025 in KR Application No. 10-2022-7037995, with English Translation.
KR Office Action dated Jan. 15, 2025 in KR Application No. 10-2023-7023253, with English Translation.
KR Office Action dated Mar. 13, 2025 in KR Application No. 10-2023-7004801, with English Translation.
TW Office Action and Search Report dated Jan. 16, 2025 in TW Application No. 113105443, with English Translation.
TW Office Action dated Jan. 20, 2025 in TW Application No. 108146890, with English Translation.
TW Office Action dated Mar. 11, 2025 in TW Application No. 110126445, with English Translation.
U.S. Corrected Notice of Allowance dated Dec. 30, 2024 in U.S. Appl. No. 17/309,587.
U.S. Corrected Notice of Allowance dated Dec. 31, 2024 in U.S. Appl. No. 18/377,267.
U.S. Corrected Notice of Allowance dated Mar. 20, 2025 in U.S. Appl. No. 18/377,245.
U.S. Non-Final Office Action dated Feb. 20, 2025 in U.S. Appl. No. 18/700,238.
U.S. Non-Final Office Action dated Jan. 3, 2025 in U.S. Appl. No. 18/769,038.
U.S. Non-Final Office Action dated Mar. 5, 2025 in U.S. Appl. No. 18/850,628.
U.S. Notice of Allowance dated Apr. 9, 2025 in U.S. Appl. No. 18/850,990.
U.S. Notice of Allowance dated Dec. 13, 2024 in U.S. Appl. No. 18/377,267.
U.S. Notice of Allowance dated Mar. 7, 2025 in U.S. Appl. No. 18/377,245.
U.S. Appl. No. 19/076,745, inventors Yu J et al., filed Mar. 11, 2025.
U.S. Restriction Requirement dated Mar. 20, 2025 in U.S. Appl. No. 17/753,110.
U.S. Supplemental Notice of Allowance dated Mar. 17, 2025 in U.S. Appl. No. 18/377,267.
Barret M C., et al., "Copper, Zinc and Tin Hydroxypyridinones," Transition Metal Chemistry, Jan. 2015, vol. 40, pp. 241-254.
Cilibrizzi A., et al., "Hydroxypyridinone Journey into Metal Chelation," Chemical Review, Jul. 2018, vol. 118, pp. 7657-7701.
CN Office Action dated May 29, 2025 in CN Application No. 202211142175.7 with English translation.
Fitzgerald A., et al., "Determination of Trace Metals in Positive Photoresist," Journal of the Electrochemical Society, May 1992, vol. 139 (5), pp. 1413-1414.
JP Office Action dated Jun. 10, 2025 in JP Application No. 2024-559372, with English Translation.
JP Office Action dated May 13, 2025 in JP Application No. 2023-502906, with English Translation.
KR Office Action dated Jul. 22, 2025 in KR Application No. 10-2024-7037744, with English Translation.
SG Written Opinion dated Jun. 30, 2025 in SG Application No. 11202114183P.
SG Written Opinion dated Jun. 30, 2025 in SG Application No. 11202251459E.
Stowers et al.; "Directly patterned inorganic hard mask for EUV lithography"; proceedings of the SPIE 7969; Extreme Ultraviolet (EUV) Lithography 11, 796915-1-11 (Apr. 7, 2011), event: SPI E Advanced Lithography, 2011, San Jose California.
TW Office Action and Search Report dated Jul. 8, 2025 in TW Application No. 110145602, with English Translation.
TW Office Action dated Apr. 17, 2025 in TW Application No. 113105443, with English Translation.
TW Office Action dated Apr. 17, 2025 in TW Application No. 113118322, with English Translation.
TW Office Action dated Jul. 24, 2025 in TW Application No. 113118322, with English Translation.
U.S. Final Office Action dated Jul. 1, 2025 in U.S. Appl. No. 18/850,628.
U.S. Final Office Action dated Jun. 6, 2025 in U.S. Appl. No. 18/700,238.
U.S. Non-Final Office Action dated Apr. 17, 2025 in U.S. Appl. No. 18/769,038.
US Non-Final Office Action dated Jul. 14, 2025 in U.S. Appl. No. 18/005,571.
US Non-Final Office Action dated Jul. 15, 2025 in U.S. Appl. No. 18/254,787.
US Non-Final Office Action dated Jun. 18, 2025 in U.S. Appl. No. 17/753,110.
U.S. Notice of Allowance dated Jul. 8, 2025 in U.S. Appl. No. 18/850,990.
U.S. Appl. No. 19/179,005, inventors Dictus D et al., filed Apr. 15, 2025.
U.S. Appl. No. 19/181,906, inventors Li D et al., filed Apr. 17, 2025.
U.S. Appl. No. 19/182,430, inventors Weidman T.W et al., filed Apr. 17, 2025.
U.S. Appl. No. 19/202,425, inventors Hansen E.C et al., filed May 8, 2025.
JP Office Action dated Aug. 5, 2025 in JP Application No. 2021-575910, with English Translation.
EP Extended European Search report dated Sep. 24, 2025 in EP Application No. 25172399.5.
EP Office Action dated Oct. 24, 2025 in EP Application No. 24775376.7.
International Preliminary Report on Patentability and Written Opinion dated Oct. 2, 2025 in PCT Application No. PCT/US2024/019555.
JP Office Action dated Sep. 9, 2025 in JP Application No. 2023-502906, with English Translation.
KR Office Action dated Aug. 27, 2025 in KR Application No. 10-2022-7014896, with English Translation.
TW Office Action and Search Report dated Nov. 6, 2025 in TW Application No. 113109390, with English Translation.
TW Office Action and Search Report dated Oct. 31, 2025 in TW Application No. 113128085, with English Translation.
U.S. Final Office Action dated Aug. 20, 2025 in U.S. Appl. No. 18/769,038.
U.S. Non-Final Office Action dated Oct. 1, 2025 in U.S. Appl. No. 17/905,632.
U.S. Notice of Allowance dated Oct. 17, 2025 in U.S. Appl. No. 18/769,038.
U.S. Notice of Allowance dated Sep. 16, 2025 in U.S. Appl. No. 18/700,238.
U.S. Appl. No. 19/352,826, inventors Lee Y et al., filed on Oct. 8, 2025.
U.S. Appl. No. 19/387,102, inventors Li D et al., filed on Nov. 12, 2025.

* cited by examiner

PHOTORESIST DEVELOPMENT WITH HALIDE CHEMISTRIES

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

BACKGROUND

The fabrication of semiconductor devices, such as integrated circuits, is a multi-step process involving photolithography. In general, the process includes the deposition of material on a wafer, and patterning the material through lithographic techniques to form structural features (e.g., transistors and circuitry) of the semiconductor device. The steps of a typical photolithography process known in the art include: preparing the substrate; applying a photoresist, such as by spin coating; exposing the photoresist to light in a desired pattern, causing the exposed areas of the photoresist to become more or less soluble in a developer solution; developing by applying a developer solution to remove either the exposed or the unexposed areas of the photoresist; and subsequent processing to create features on the areas of the substrate from which the photoresist has been removed, such as by etching or material deposition.

The evolution of semiconductor design has created the need, and has been driven by the ability, to create ever smaller features on semiconductor substrate materials. This progression of technology has been characterized in "Moore's Law" as a doubling of the density of transistors in dense integrated circuits every two years. Indeed, chip design and manufacturing has progressed such that modern microprocessors may contain billions of transistors and other circuit features on a single chip. Individual features on such chips may be on the order of 22 nanometers (nm) or smaller, in some cases less than 10 nm.

One challenge in manufacturing devices having such small features is the ability to reliably and reproducibly create photolithographic masks having sufficient resolution. Current photolithography processes typically use 193 nm ultraviolet (UV) light to expose a photoresist. The fact that the light has a wavelength significantly greater than the desired size of the features to be produced on the semiconductor substrate creates inherent issues. Achieving feature sizes smaller than the wavelength of the light requires use of complex resolution enhancement techniques, such as multipatterning. Thus, there is significant interest and research effort in developing photolithographic techniques using shorter wavelength light, such as extreme ultraviolet radiation (EUV), having a wavelength of from 10 nm to 15 nm, e.g., 13.5 nm.

EUV photolithographic processes can present challenges, however, including low power output and loss of light during patterning. Traditional organic chemically amplified resists (CAR) similar to those used in 193 nm UV lithography have potential drawbacks when used in EUV lithography, particularly as they have low absorption coefficients in EUV region and the diffusion of photo-activated chemical species can result in blur or line edge roughness. Furthermore, in order to provide the etch resistance required to pattern underlying device layers, small features patterned in conventional CAR materials can result in high aspect ratios at risk of pattern collapse. Accordingly, there remains a need for improved EUV photoresist materials, having such properties as decreased thickness, greater absorbance, and greater etch resistance.

The background description provided herein is for the purpose of generally presenting the context of the present technology. Work of the presently named inventors, to the extent it is described in this background section, as well as aspects of the description that may not otherwise qualify as prior art at the time of filing, are neither expressly nor impliedly admitted as prior art against the present technology.

SUMMARY

Development of photoresists can be useful, for example, to form a patterning mask in the context of high-resolution patterning. Development can selectively remove either an exposed or unexposed portion of the resist using a certain development chemistry. The development chemistry can include a halide such as a hydrogen halide or a mixture of hydrogen and halide gas. In some embodiments, the development is a dry development. In some embodiments, the resist is a photopatterned metal-containing EUV resist. In some embodiments, the dry development process is a plasma-free thermal process.

Disclosed herein are methods and systems of processing a semiconductor substrate. A method of processing the semiconductor substrate includes providing in a process chamber a photopatterned metal-containing resist on a substrate layer of the semiconductor substrate, and developing the photopatterned metal-containing resist by selectively removing a portion of the resist by exposure to a development chemistry comprising a halide to form a resist mask.

In some implementations, the photopatterned metal-containing resist is a photopatterned metal-containing EUV resist. In some implementations, developing the photopatterned metal-containing EUV resist includes selectively removing an EUV-unexposed portion of the EUV resist relative to an EUV-exposed portion with the development chemistry to form the resist mask. In some implementations, the development chemistry includes a hydrogen halide, hydrogen gas and halide gas, an organic halide, an acyl halide, a carbonyl halide, a thionyl halide, or mixtures thereof. In some implementations, the development chemistry includes hydrogen fluoride, hydrogen chloride, hydrogen bromide, or hydrogen iodide. In some implementations, developing the photopatterned metal-containing resist by exposure to the development chemistry comprises dry developing the photopatterned metal-containing resist by exposure to a dry development chemistry. In some implementations, dry developing the photopatterned metal-containing resist comprises applying a remote plasma including radicals of the halide to the resist. In some implementations, dry developing the photopatterned metal-containing resist occurs at a temperature between −60° C. and 120° C., at a chamber pressure between 0.1 mTorr and 500 mTorr or between about 0.5 Torr and about 760 Torr, at a gas flow rate of the halide between 100 sccm and 2000 sccm, an etch selectivity of the resist mask being tunable based at least in part on the temperature, the chamber pressure, the gas flow rate, or combinations thereof. In some implementations, the temperature is between −20° C. and 20° C. In some implementations, the photopatterned metal-containing resist comprises an element selected from the group consisting of: tin, hafnium, tellurium, bismuth, indium, antimony, iodine, and germanium. In some implementations, the method further includes exposing, after developing the photopatterned metal-containing resist, the photopatterned metal-containing resist to an inert gas plasma. In some implementations, the method further includes depositing a metal-containing EUV resist film on the semiconductor substrate, and non-selectively removing the metal-containing EUV resist film from the semiconductor substrate without removing the substrate layer prior to providing the photopatterned metal-containing resist.

Disclosed herein is an apparatus for development of resist. The apparatus includes a process chamber with a substrate support, a vacuum line coupled to the process chamber, and a development chemistry line coupled to the process chamber. The apparatus further includes a controller configured with instructions for processing a semiconductor substrate, the instructions comprising code for: providing in the process chamber a photopatterned metal-containing resist on a substrate layer of the semiconductor substrate, and developing the photopatterned metal-containing resist by selectively removing a portion of the resist by exposure to a development chemistry comprising a halide to form a resist mask.

In some implementations, the photopatterned metal-containing resist is a photopatterned metal-containing EUV resist, and wherein the controller configured with instructions comprising code for developing the photopatterned metal-containing EUV resist comprises code for selectively removing an EUV-unexposed portion of the EUV resist relative to an EUV-exposed portion with the development chemistry to form the resist mask. In some implementations, the apparatus further includes one or more heaters coupled to the substrate support, wherein the one or more heaters include a plurality of independently controllable temperature control zones. In some implementations, an interior of the process chamber is coated with a corrosion inhibitor. In some implementations, the apparatus further includes a cold trap coupled to the process chamber, wherein the cold trap is configured to remove water from the process chamber. In some implementations, the apparatus further includes a UV or IR lamp coupled to the process chamber, wherein the UV or IR lamp is configured to cure the photopatterned metal-containing resist or remove excess halide from the process chamber.

Disclosed herein is a method of processing a semiconductor substrate. The method includes providing in a process chamber a dry-deposited photopatterned metal oxide EUV resist on a substrate layer of a semiconductor substrate, and dry developing the photopatterned metal oxide EUV resist by selectively removing an EUV-unexposed portion of the EUV resist by exposure to a dry development chemistry comprising a hydrogen halide to form a resist hard mask from the EUV-exposed portion.

In some implementations, dry developing occurs in a plasma-free thermal process, where exposure to the dry development chemistry occurs at a temperature between about −20° C. and about 20° C. In some implementations, the photopatterned metal oxide EUV resist includes an organotin oxide.

These and other features of the disclosed embodiments will be described in detail below with reference to the associated drawings.

DETAILED DESCRIPTION

Figure 1:
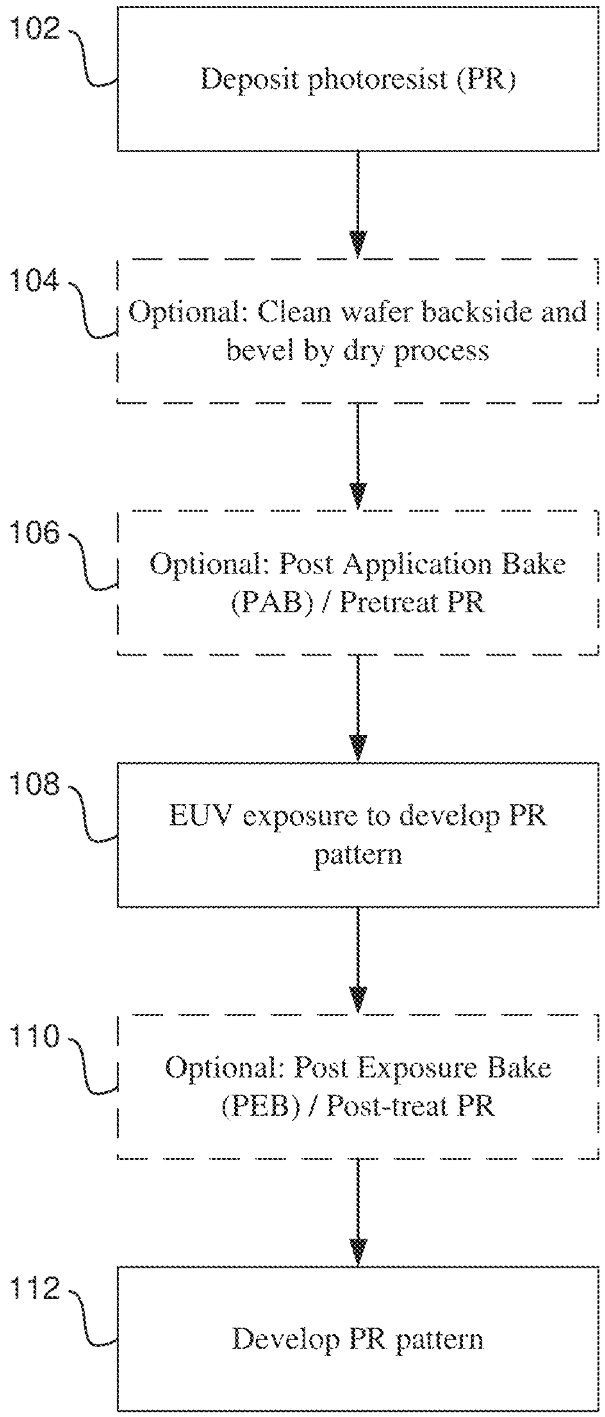
FIG. 1 presents a flow diagram of an example method for depositing and developing a photoresist according to some embodiments.

This disclosure relates generally to the field of semiconductor processing. In particular aspects, the disclosure is directed to processes and apparatuses for development of photoresists (e.g., EUV-sensitive metal and/or metal oxide-containing photoresists) using halide chemistries, for example to form a patterning mask in the context of EUV patterning.

Reference is made herein in detail to specific embodiments of the disclosure. Examples of the specific embodiments are illustrated in the accompanying drawings. While the disclosure will be described in conjunction with these specific embodiments, it will be understood that it is not intended to limit the disclosure to such specific embodiments. On the contrary, it is intended to cover alternatives, modifications, and equivalents as may be included within the spirit and scope of the disclosure. In the following description, numerous specific details are set forth in order to provide a thorough understanding of the present disclosure. The present disclosure may be practiced without some or all of these specific details. In other instances, well known process operations have not been described in detail so as to not unnecessarily obscure the present disclosure.

INTRODUCTION

Patterning of thin films in semiconductor processing is often an important step in the fabrication of semiconductors. Patterning involves lithography. In conventional photolithography, such as 193 nm photolithography, patterns are printed by emitting photons from a photon source onto a mask and printing the pattern onto a photosensitive photoresist, thereby causing a chemical reaction in the photoresist that, after development, removes certain portions of the photoresist to form the pattern.

Advanced technology nodes (as defined by the International Technology Roadmap for Semiconductors) include nodes 22 nm, 16 nm, and beyond. In the 16 nm node, for example, the width of a typical via or line in a Damascene structure is typically no greater than about 30 nm. Scaling of features on advanced semiconductor integrated circuits (ICs) and other devices is driving lithography to improve resolution.

Extreme ultraviolet (EUV) lithography can extend lithography technology by moving to smaller imaging source wavelengths than would be achievable with conventional photolithography methods. EUV light sources at approximately 10-20 nm, or 11-14 nm wavelength, for example 13.5 nm wavelength, can be used for leading-edge lithography tools, also referred to as scanners. The EUV radiation is strongly absorbed in a wide range of solid and fluid materials including quartz and water vapor, and so operates in a vacuum.

EUV lithography makes use of EUV resists that are patterned to form masks for use in etching underlying layers. EUV resists may be polymer-based chemically amplified resists (CARs) produced by liquid-based spin-on techniques. An alternative to CARs is directly photopatternable metal oxide-containing films, such as those available from Inpria, Corvallis, OR, and described, for example, in US Patent Publications US 2017/0102612, US 2016/021660 and US 2016/0116839, incorporated by reference herein at least for their disclosure of photopatternable metal oxide-containing films. Such films may be produced by spin-on techniques or dry vapor-deposited. The metal oxide-containing film can be patterned directly (i.e., without the use of a separate photoresist) by EUV exposure in a vacuum ambient providing sub-30 nm patterning resolution, for example as described in U.S. Pat. No. 9,996,004, issued Jun. 12, 2018 and titled EUV PHOTOPATTERNING OF VAPOR-DEPOSITED METAL OXIDE-CONTAINING HARDMASKS, and/or in Application PCT/US19/31618, filed May 9, 2019, and titled METHODS FOR MAKING EUV PATTERNABLE HARD MASKS, the disclosures of which at least relating to the composition, deposition, and patterning of directly photopatternable metal oxide films to form EUV resist masks is incorporated by reference herein. Generally, the patterning involves exposure of the EUV resist with EUV radiation to form a photo pattern in the resist, followed by development to remove a portion of the resist according to the photo pattern to form the mask.

It should also be understood that the while present disclosure relates to lithographic patterning techniques and materials exemplified by EUV lithography, it is also applicable to other next generation lithographic techniques. In addition to EUV, which includes the standard 13.5 nm EUV wavelength currently in use and development, the radiation sources most relevant to such lithography are DUV (deep-UV), which generally refers to use of 248 nm or 193 nm excimer laser sources, X-ray, which formally includes EUV at the lower energy range of the X-ray range, as well as e-beam, which can cover a wide energy range. The specific methods may depend on the particular materials and applications used in the semiconductor substrate and ultimate semiconducting device. Thus, the methods described in this application are merely exemplary of the methods and materials that may be used in present technology.

Directly photopatternable EUV resists may be composed of or contain metals and/or metal oxides mixed within organic components. The metals/metal oxides are highly promising in that they can enhance the EUV photon adsorption and generate secondary electrons and/or show increased etch selectivity to an underlying film stack and device layers. To date, these resists have been developed using a wet (solvent) approach, which requires the wafer to move to the track, where it is exposed to developing solvent, dried and baked. Wet development does not only limit productivity but can also lead to line collapse due to surface tension effects and/or delamination.

Dry development techniques have been proposed to overcome these issues by eliminating substrate delamination and interface failures. Dry development can improve performance (e.g., prevent line collapse due to surface tension and delamination in wet development) and enhance throughput (e.g., by avoiding wet development track). Other advantages may include eliminating the use of organic solvent developers, reduced sensitivity to adhesion issues, increased EUV absorption for improved dose efficiency, and a lack of solubility-based limitations. Dry development can also provide more tunability and give further critical dimension (CD) control and scum removal.

Dry development has its own challenges, including etch selectivity between unexposed and EUV exposed resist material which can lead to a higher dose to size requirement for effective resist exposure when compared to wet development. Suboptimal selectivity can also cause PR corner rounding due to longer exposures under etching gas, which may increase line CD variation in the following transfer etch step.

Development of EUV Resist

According to various aspects of the present disclosure, a photopatterned metal-containing photoresist is developed by exposure to halide-containing chemistries. An EUV-sensitive metal or metal oxide-containing film, e.g., an organotin oxide, is disposed on a semiconductor substrate. The EUV-sensitive metal or metal oxide-containing film is patterned directly by EUV exposure in vacuum ambient. A pattern is then developed to form a resist mask using a development chemistry. In some embodiments, the development chemistry is a dry development chemistry. In some embodiments, the dry development chemistry includes hydrogen and a halide. Such dry development techniques may be done while using either a gentle plasma (high pressure, low power) or a thermal process while flowing a hydrogen and halide dry development chemistry. This disclosure provides processes and apparatus configured for development of a metal-containing resist as part of a resist mask formation process. Various embodiments include combining all dry operations by vapor deposition, EUV lithographic patterning, and dry development. Various other embodiments include a combination of wet and dry processing operations, for example, spin-on EUV photoresists (wet process) may be combined with dry development or other wet or dry processes as described herein. Also described are various post-deposition (or post-application) processes such as bevel and backside cleaning, chamber cleaning, descum, smoothing, and curing to modify and enhance film characteristics, and photoresist rework processing.

FIG. 1 presents a flow diagram of an example method for depositing and developing a photoresist according to some embodiments. The operations of a process 100 may be performed in different orders and/or with different, fewer, or additional operations. Aspects of the process 100 may be described with reference to FIGS. 2A-2C, 3, and 4A-4B. One or more operations of the process 100 may be performed using an apparatus described in any one of FIGS. 12-15. In some embodiments, the operations of the process 100 may be implemented, at least in part, according to software stored in one or more non-transitory computer readable media.

At block 102 of the process 100, a layer of photoresist is deposited. This may be either a dry deposition process such as a vapor deposition process or a wet process such as a spin-on deposition process.

The photoresist may be a metal-containing EUV resist. An EUV-sensitive metal or metal oxide-containing film may be deposited on a semiconductor substrate by any suitable technique, including wet (e.g., spin-on) or dry (e.g., CVD) deposition techniques. For example, described processes have been demonstrated for EUV photoresist compositions based on organotin oxides, being applicable to both commercially spin-coatable formulations (e.g., such as are available from Inpria Corp, Corvallis, OR) and formulations applied using dry vacuum deposition techniques, further described below.

Semiconductor substrates may include any material construct suitable for photolithographic processing, particularly for the production of integrated circuits and other semiconducting devices. In some embodiments, semiconductor substrates are silicon wafers. Semiconductor substrates may be silicon wafers upon which features have been created ("underlying features"), having an irregular surface topography. As referred to herein, the "surface" is a surface onto which a film of the present disclosure is to be deposited or that is to be exposed to EUV during processing. Underlying features may include regions in which material has been removed (e.g., by etching) or regions in which materials have been added (e.g., by deposition) during processing prior to conducting a method of this disclosure. Such prior processing may include methods of this disclosure or other processing methods in an iterative process by which two or more layers of features are formed on the substrate.

EUV-sensitive thin films may be deposited on the semiconductor substrate, such films being operable as resists for subsequent EUV lithography and processing. Such EUV-sensitive thin films comprise materials which, upon exposure to EUV, undergo changes, such as the loss of bulky pendant substituents bonded to metal atoms in low density M-OH rich materials, allowing their crosslinking to denser M-O-M bonded metal oxide materials. Through EUV patterning, areas of the film are created that have altered physical or chemical properties relative to unexposed areas. These properties may be exploited in subsequent processing, such as to dissolve either unexposed or exposed areas, or to selectively deposit materials on either the exposed or unexposed areas. In some embodiments, the unexposed film has a more hydrophobic surface than the exposed film under the conditions at which such subsequent processing is performed. For example, the removal of material may be performed by leveraging differences in chemical composition, density and cross-linking of the film. Removal may be by wet processing or dry processing, as further described below.

The thin films are, in various embodiments, organometallic materials, for example organotin materials comprising tin oxide, or other metal oxide materials/moieties. The organometallic compounds may be made in a vapor phase reaction of an organometallic precursor with a counter reactant. In various embodiments, the organometallic compounds are formed through mixing specific combinations of organometallic precursors having bulky alkyl groups or fluoroalkyl groups with counter-reactants and polymerizing the mixture in the vapor phase to produce a low-density, EUV-sensitive material that deposits onto the semiconductor substrate.

In various embodiments, organometallic precursors comprise at least one alkyl group on each metal atom that can survive the vapor-phase reaction, while other ligands or ions coordinated to the metal atom can be replaced by the counter-reactants. Organometallic precursors include those of the formula:

$$M_aR_bL_c \qquad \text{(Formula 1)}$$

wherein: M is an element with a high patterning radiation-absorption cross-section; R is alkyl, such as $C_nH_{2n+1}$, preferably wherein n≥2; L is a ligand, ion or other moiety which is reactive with the counter-reactant; a≥1; b≥1; and c≥1.

In various embodiments, M has an atomic absorption cross section equal to or greater than $1\times10^7$ $cm^2$/mol. M may be, for example, selected from the group consisting of tin, hafnium, tellurium, bismuth, indium, antimony, iodine, germanium, and combinations thereof. In some embodiments, M is tin. R may be fluorinated, e.g., having the formula $C_nF_xH_{(2n+1)}$. In various embodiments, R has at least one beta-hydrogen or beta-fluorine. For example, R may be selected from the group consisting of ethyl, i-propyl, n-propyl, t-butyl, i-butyl, n-butyl, sec-butyl, n-pentyl, i-pentyl, t-pentyl, sec-pentyl, and mixtures thereof. L may be any moiety readily displaced by a counter-reactant to generate an M-OH moiety, such as a moiety selected from the group consisting of amines (such as dialkylamino, monoalkylamino), alkoxy, carboxylates, halogens, and mixtures thereof.

Organometallic precursors may be any of a wide variety of candidate metal-organic precursors. For example, where M is tin, such precursors include t-butyl tris(dimethylamino) tin, i-butyl tris(dimethylamino) tin, n-butyl tris(dimethylamino) tin, sec-butyl tris(dimethylamino) tin, i-propyl(tris) dimethylamino tin, n-propyl tris(dimethylamino) tin, ethyl tris(dimethylamino) tin and analogous alkyl(tris)(t-butoxy) tin compounds such as t-butyl tris(t-butoxy) tin. In some embodiments, the organometallic precursors are partially fluorinated.

Counter-reactants have the ability to replace the reactive moieties, ligands or ions (e.g., L in Formula 1, above) so as to link at least two metal atoms via chemical bonding. Counter-reactants can include water, peroxides (e.g., hydrogen peroxide), di- or polyhydroxy alcohols, fluorinated di- or polyhydroxy alcohols, fluorinated glycols, and other sources of hydroxyl moieties. In various embodiments, a counter-reactant reacts with the organometallic precursor by forming oxygen bridges between neighboring metal atoms.

Other potential counter-reactants include hydrogen sulfide and hydrogen disulfide, which can crosslink metal atoms via sulfur bridges.

The thin films may include optional materials in addition to an organometallic precursor and counter-reactants to modify the chemical or physical properties of the film, such as to modify the sensitivity of the film to EUV or enhancing etch resistance. Such optional materials may be introduced, such as by doping during vapor phase formation prior to deposition on the semiconductor substrate, after deposition of the thin film, or both. In some embodiments, a gentle remote $H_2$ plasma may be introduced so as to replace some Sn-L bonds with Sn—H, which can increase reactivity of the resist under EUV.

In various embodiments, the EUV-patternable films are made and deposited on the semiconductor substrate using vapor deposition equipment and processes among those known in the art. In such processes, the polymerized organometallic material is formed in vapor phase or in situ on the surface of the semiconductor substrate. Suitable processes include, for example, chemical vapor deposition (CVD), atomic layer deposition (ALD), and ALD with a CVD component, such as a discontinuous, ALD-like process in which metal precursors and counter-reactants are separated in either time or space.

In general, methods comprise mixing a vapor stream of an organometallic precursor with a vapor stream of a counter-reactant so as to form a polymerized organometallic material, and depositing the organometallic material onto the surface of the semiconductor substrate. In some embodiments, more than one organometallic precursor is included in the vapor stream. In some embodiments, more than one counter-reactant is included in the vapor stream. As will be understood by one of ordinary skill in the art, the mixing and depositing aspects of the process may be concurrent, in a substantially continuous process.

In an example continuous CVD process, two or more gas streams, in separate inlet paths, of organometallic precursor and source of counter-reactant are introduced to the deposition chamber of a CVD apparatus, where they mix and react in the gas phase, to form agglomerated polymeric materials (e.g., via metal-oxygen-metal bond formation). The streams may be introduced, for example, using separate injection inlets or a dual-plenum showerhead. The apparatus is configured so that the streams of organometallic precursor and counter-reactant are mixed in the chamber, allowing the organometallic precursor and counter-reactant to react to form a polymerized organometallic material. Without limiting the mechanism, function, or utility of present technology, it is believed that the product from such vapor-phase reaction becomes heavier in molecular weight as metal atoms are crosslinked by counter-reactants, and is then condensed or otherwise deposited onto the semiconductor substrate. In various embodiments, the steric hindrance of the bulky alkyl groups prevents the formation of densely packed network and produces smooth, amorphous, low-density films.

The CVD process is generally conducted at reduced pressures, such as from 10 milliTorr to 10 Torr. In some embodiments, the process is conducted at from 0.5 to 2 Torr. In some embodiments, the temperature of the semiconductor substrate is at or below the temperature of the reactant streams. For example, the substrate temperature may be from 0° C. to 250° C., or from ambient temperature (e.g., 23° C.) to 150° C. In various processes, deposition of the polymerized organometallic material on the substrate occurs at rates inversely proportional to surface temperature.

In some embodiments, the EUV-patternable films are made and deposited on the semiconductor substrate using wet deposition equipment and processes among those known in the art. For example, the organometallic material is formed by spin-coating on the surface of the semiconductor substrate.

The thickness of the EUV-patternable film formed on the surface of the semiconductor substrate may vary according to the surface characteristics, materials used, and processing conditions. In various embodiments, the film thickness may range from 0.5 nm to 100 nm, and may be a sufficient thickness to absorb most of the EUV light under the conditions of EUV patterning. The EUV-patternable film may be able to accommodate absorption equal to or greater than 30%, thereby having significantly fewer EUV photons available towards the bottom of the EUV-patternable film. Higher EUV absorption leads to more cross-linking and densification near the top of an EUV-exposed film compared to the bottom of the EUV-exposed film. Though insufficient cross-linking may cause the resist to be more prone to liftoff or collapse in wet development, such as risk is not as present in dry development. An all-dry lithography approach may facilitate more efficient utilization of EUV photons by more opaque resist films. Though efficient utilization of EUV photons may occur with EUV-patternable films having higher overall absorption, it will be understood that in some instances, the EUV-patternable film may be less than about 30%. For comparison, the maximum overall absorption of most other resist films is less than 30% (e.g., 10% or less, or 5% or less) so that the resist material at the bottom of the resist film is sufficiently exposed. In some embodiments, the film thickness is from 10 nm to 40 nm or from 10 nm to 20 nm. Without limiting the mechanism, function, or utility of present disclosure, it is believed that, unlike wet, spin-coating processes of the art, the processes of the present disclosure have fewer restrictions on the surface adhesion properties of the substrate, and therefore can be applied to a wide variety of substrates. Moreover, as discussed above, the deposited films may closely conform to surface features, providing advantages in forming masks over substrates, such as substrates having underlying features, without "filling in" or otherwise planarizing such features.

At block 104, an optional cleaning process is performed to clean a backside and/or bevel edge of the semiconductor substrate. The backside and/or bevel edge clean may non-selectively etch EUV resist film to equally remove film with various levels of oxidation or crosslinking on the substrate backside and bevel edge. During application of the EUV-patternable film, either by wet deposition processing or dry deposition processing, there may be some unintended deposition of resist material on the substrate bevel edge and/or backside. The unintended deposition may lead to undesirable particles later moving to a top surface of the semiconductor substrate and becoming particle defects. Moreover, this bevel edge and backside deposition can cause downstream processing problems, including contamination of the patterning (scanner) and development tools. Conventionally, removal of this bevel edge and backside deposition is done by wet cleaning techniques. For spin-coated photoresist material, this process is called edge bead removal (EBR) and is performed by directing a stream of solvent from above and below the bevel edge while the substrate is spinning. The same process can be applied to soluble organotin oxide-based resists deposited by vapor deposition techniques.

The substrate bevel edge and/or backside clean may also be a dry clean process. In some embodiments, the dry clean process involves a vapor and/or plasma having one or more of the following gases: HBr, HCl, $BCl_3$, $SOCl_2$, $Cl_2$, $BBr_3$, $H_2$, $O_2$, $PCl_3$, $CH_4$, methanol, ammonia, formic acid, $NF_3$, HF. In some embodiments, the dry clean process may use the same chemistries as a dry development process described herein. For example, the bevel edge and backside clean may use hydrogen halide development chemistry. For the backside and bevel edge clean process, the vapor and/or the plasma has to be limited to a specific region of the substrate to ensure that only the backside and the bevel are removed, without any film degradation on a frontside of the substrate.

Process conditions may be optimized for bevel edge and backside clean. In some embodiments, higher temperature, higher pressure, and/or higher reactant flow may lead to increased etch rate. Suitable process conditions for a dry bevel edge and backside clean may be: reactant flow of 100-10000 sccm (e.g., 500 sccm HCl, HBr, HI, or $H_2$ and $Cl_2$ or $Br_2$, $BCl_3$ or $H_2$), temperature of 20 to 140° C. (e.g., 80° C.), pressure of 20-1000 mTorr (e.g., 100 mTorr), plasma power of 0 to 500 W at high frequency (e.g., 13.56 MHz), and for a time of about 10 to 20 seconds, dependent on the photoresist film and composition and properties. It should be understood that while these conditions are suitable for some processing reactors, e.g., a Kiyo etch tool available from Lam Research Corporation, Fremont, CA, a wider range of process conditions may be used according to the capabilities of the processing reactor.

The dry-cleaning operation may alternatively be extended to a full photoresist removal or photoresist "rework" in which an applied EUV photoresist is removed and the semiconductor substrate prepared for photoresist reapplication, such as when the original photoresist is damaged or otherwise defective. Photoresist rework should be accomplished without damaging the underlying semiconductor substrate, so an oxygen-based etch should be avoided. Instead, variants of halide-containing chemistries as described herein may be used. It will be understood that the photoresist rework operation may be applied at any stage during the process 100. Thus, the photoresist rework operation may be applied after photoresist deposition, after bevel edge and backside clean, after PAB treatment, after EUV exposure, after PEB treatment, or after development. In some embodiments, the photoresist rework may be performed for non-selective removal of exposed and unexposed regions of the photoresist but selective to an underlayer.

In some embodiments, the photoresist rework process involves a vapor and/or plasma having one or more of the following gases: HBr, HCl, HI, $BCl_3$, $Cl_2$, $BBr_3$, $H_2$, $PCl_3$, $CH_4$, methanol, ammonia, formic acid, $NF_3$, HF. In some embodiments, the photoresist rework process may use the same chemistries as a dry development process described herein. For example, the photoresist rework may use hydrogen halide development chemistry.

Process conditions may be optimized for the photoresist rework. In some embodiments, higher temperature, higher pressure, and/or higher reactant flow may lead to increased etch rate. Suitable process conditions for a photoresist rework may be: reactant flow of 100-500 sccm (e.g., 500 sccm HCl, HBr, HI, $BCl_3$ or $H_2$ and $Cl_2$ or $Br_2$), temperature of 20 to 140° C. (e.g., 80° C.), pressure of 20-1000 mTorr (e.g., 300 mTorr), plasma power of 300 to 800 W (e.g., 500 W) at high frequency (e.g., 13.56 MHz), wafer bias of 0 to 200 $V_b$ (a higher bias may be used with harder underlying substrate materials) and for a time of about 20 seconds to 3 minutes, sufficient to completely remove the EUV photoresist, dependent on the photoresist film and composition and properties. It should be understood that while these conditions are suitable for some processing reactors, e.g., a Kiyo etch tool available from Lam Research Corporation, Fremont, CA, a wider range of process conditions may be used according to the capabilities of the processing reactor.

At block 106 of the process 100, an optional post-application bake (PAB) is performed after deposition of the EUV-patternable film and prior to EUV exposure. The PAB treatment may involve a combination of thermal treatment, chemical exposure, and moisture to increase the EUV sensitivity of the EUV-patternable film, reducing the EUV dose to develop a pattern in the EUV-patternable film. The PAB treatment temperature may be tuned and optimized for increasing the sensitivity of the EUV-patternable film. For example, the treatment temperature may be between about 90° C. and about 200° C. or between about 150° C. and about 190° C. In some embodiments, the PAB treatment may be conducted with a pressure between atmospheric and vacuum, and a treatment duration of about 1 to 15 minutes, for example about 2 minutes. In some embodiments, the PAB treatment is conducted at a temperature between about 100° C. to 200° C. for about 1 minute to 2 minutes.

At block 108 of the process 100, the metal-containing EUV resist film is exposed to EUV radiation to develop a pattern. Generally speaking, the EUV exposure causes a change in the chemical composition and cross-linking in the metal-containing EUV resist film, creating a contrast in etch selectivity that can be exploited for subsequent development.

The metal-containing EUV resist film may then be patterned by exposing a region of the film to EUV light, typically under relatively high vacuum. EUV devices and imaging methods among those useful herein include methods known in the art. In particular, as discussed above, exposed areas of the film are created through EUV patterning that have altered physical or chemical properties relative to unexposed areas. For example, in exposed areas, metal-carbon bond cleavage may occur, as through a beta-hydride elimination, leaving behind reactive and accessible metal hydride functionality that can be converted to hydroxide and cross-linked metal oxide moieties via metal-oxygen bridges during a subsequent post-exposure bake (PEB) step. This process can be used to create chemical contrast for development as a negative tone resist. In general, a greater number of beta-H in the alkyl group results in a more sensitive film. This can also be explained as weaker Sn—C bonding with more branching. Following exposure, the metal-containing EUV resist film may be baked, so as to cause additional cross-linking of the metal oxide film. The difference in properties between exposed and unexposed areas may be exploited in subsequent processing, such as to dissolve unexposed areas or to deposit materials on the exposed areas. For example the pattern can be developed using a dry method to form a metal oxide-containing mask.

In particular, in various embodiments, the hydrocarbyl-terminated tin oxide present on the surface is converted to hydrogen-terminated tin oxide in the exposed region(s) of an imaging layer, particularly when the exposure is performed in a vacuum using EUV. However, removing exposed imaging layers from vacuum into air, or the controlled introduction of oxygen, ozone, $H_2O_2$, or water, can result in the oxidation of surface Sn—H into Sn—OH. The difference in properties between exposed and unexposed regions may be exploited in subsequent processing, such as by reacting the irradiated region, the unirradiated region, or both, with one or more reagents to selectively add material to or remove material from the imaging layer.

Without limiting the mechanism, function or utility of present technology, EUV exposure, for example, at doses of from 10 $mJ/cm^2$ to 100 $mJ/cm^2$ results in the cleavage of Sn—C bonds resulting is loss of the alkyl substituent, alleviating steric hindrance and allowing the low-density film to collapse. In addition, reactive metal-H bond generated in the beta-hydride elimination reactions can react with neighboring active groups such as hydroxyls in the film, leading to further cross-linking and densification, and creating chemical contrast between exposed and unexposed region(s).

Following exposure of the metal-containing EUV resist film to EUV light, a photopatterned metal-containing EUV resist is provided. The photopatterned metal-containing EUV resist includes EUV-exposed and unexposed regions.

At block 110 of the process 100, an optional post-exposure bake (PEB) is performed to further increase contrast in etch selectivity of the photopatterned metal-containing EUV resist. The photopatterned metal-containing EUV resist can be thermally treated in the presence of various chemical species to facilitate cross-linking of the EUV-exposed regions or simply baked on a hot plate in ambient air, for example between 150° C. and 250° C. for between one and five minutes (e.g., 190° C. for two minutes).

In various embodiments, a bake strategy involves careful control of the bake ambient, introduction of reactive gases, and/or careful control of the ramping rate of the bake temperature. Examples of useful reactive gases include e.g., air, $H_2O$, $H_2O_2$ vapor, $CO_2$, CO, $O_2$, $O_3$, $CH_4$, $CH_3OH$, $N_2$, $H_2$, $NH_3$, $N_2O$, NO, alcohol, acetyl acetone, formic acid, Ar, He, or their mixtures. The PEB treatment is designed to (1) drive complete evaporation of organic fragments that are generated during EUV exposure and (2) oxidize any Sn—H, Sn—Sn, or Sn radical species generated by EUV exposure into metal hydroxide, and (3) facilitate cross-linking between neighboring Sn—OH groups to form a more densely crosslinked $SnO_2$-like network. The bake temperature is carefully selected to achieve optimal EUV lithographic performance. Too low a PEB temperature would lead to insufficient cross-linking, and consequently less chemical contrast for development at a given dose. Too high a PEB temperature would also have detrimental impacts, including severe oxidation and film shrinkage in the unexposed region (the region that is removed by development of the patterned film to form the mask in this example), as well as, undesired interdiffusion at the interface between the photopatterned metal-containing EUV resist and an underlayer, both of which can contribute to loss of chemical contrast and an increase in defect density due to insoluble scum. The PEB treatment temperature may be between about 100° C. and about 300° C., between about 170° C. and about 290° C., or between about 200° C. and about 240° C. In some embodiments, the PEB treatment may be conducted with a pressure between atmospheric and vacuum, and a treatment duration of about 1 to 15 minutes, for example about 2 minutes. In some embodiments, PEB thermal treatment may be repeated to further increase etch selectivity.

At block 112 of the process 100, the photopatterned metal-containing EUV resist is developed to form a resist mask. In various embodiments, the exposed regions are removed (positive tone) or the unexposed regions are removed (negative tone). In some embodiments, development may include selective deposition on either the exposed or unexposed regions of the photopatterned metal-containing EUV resist, followed by an etching operation. In various embodiments, these processes may be dry processes or wet processes. The development may be done without striking a plasma in some embodiments. Or, development may be done with flows of hydrogen and halide (e.g., $H_2$ and $Cl_2$ and/or $Br_2$) activated in a remote plasma source or activated by exposure to remote UV radiation. The photoresist for development may include an element selected from the group consisting of: tin, hafnium, tellurium, bismuth, indium, antimony, iodine, and germanium. The element may have a high patterning radiation-absorption cross-section. In some embodiments, the element may have a high EUV-absorption cross-section. In some embodiments, the metal-containing EUV resist may have an overall absorption greater than 30%. In an all-dry lithography process, this provides more efficient utilization of EUV photons, enabling development of thicker and more EUV-opaque resists.

Examples of processes for development involve an organotin oxide-containing EUV-sensitive photoresist thin film (e.g., 10-30 nm thick, such as 20 nm), subjected to a EUV exposure dose and post-exposure bake, and then developed. The photoresist film may be, for example, deposited based on a gas phase reaction of an organotin precursor such as isopropyl(tris)(dimethylamino)tin and water vapor, or may be a spin-on film comprising tin clusters in an organic matrix.

The photopatterned metal-containing EUV resist is developed by exposure to a development chemistry, where the development chemistry is a halide-containing chemistry. In some embodiments, the development chemistry includes hydrogen and halide, such as a hydrogen halide (e.g. HBr or HCl) or hydrogen and halogen gases (e.g., $H_2$ and $Cl_2$). In some embodiments, the development chemistry includes a hydrogen halide, hydrogen and halogen gases, boron trichloride, or combinations thereof. Development of the EUV resist can be done by wet development using halide-containing chemistries or dry development using hydrogen halide-containing chemistries. In embodiments where the EUV resist is developed using wet development, the wet development may be combined with other wet processing operations such as wet deposition (e.g., spin-on deposition) of the metal-containing EUV resist film. Alternatively, the wet development may be combined with other dry processing operations such as vapor deposition (e.g., CVD) of the metal-containing EUV resist film. In embodiments where the EUV resist is developed using dry development, the dry development may be combined with other dry processing operations such as dry deposition (e.g., CVD) of the metal-containing EUV resist film. In alternative embodiments where the EUV resist is developed using dry development, the dry development may be combined with other wet processing operations such as wet deposition (e.g., spin-on deposition) of the metal-containing EUV resist film.

In some embodiments, processing of the semiconductor substrate may combine all dry steps including film formation by vapor deposition, EUV lithographic patterning, and dry development. In fact, each of the operations 102-112 in the process 100 may be dry processing operations. Such processing operations may avoid material and productivity costs associated with wet processing operations such as wet development. Dry processing can provide more tunability and add further critical dimension (CD) control and scum removal. Wet processing generally involves moisture and/or oxygen, which more easily leads to scum formation. Wet development is limited by solubility and cluster size, whereas dry development is not limited by solubility and cluster size. Wet development is more prone to pattern collapse and delamination issues that dry development avoids. In addition, employing all-dry processing operations may facilitate integration within interconnected vacuum processing chamber without exposure to and contamination by ambient air or trace contaminates contained therein. For example, the PEB thermal treatment during which exposed regions undergo further crosslinking may be conducted in the same chamber as development, though it will be understood that the PEB thermal treatment may be performed in another chamber.

Development processes can be done by delivering development chemistry in a liquid or vapor phase. In some embodiments, dry development processes can be done by using either a gentle plasma (high pressure, low power) or a thermal process while flowing a hydrogen halide-containing dry development chemistry such as HF, HCl, HBr, or HI. For example, dry development can be carried out in a thermal process using dry development chemistry such as HCl or HBr. In some embodiments, the hydrogen halide-containing chemistry is able to quickly remove the unexposed material, leaving behind a pattern of the exposed film that can be transferred into the underlying layers by plasma-based etch processes, for example conventional etch processes.

In thermal development processes, the substrate is exposed to development chemistry (e.g., a Lewis Acid) in a process chamber (e.g., oven). In some embodiments, a vacuum line is coupled to the process chamber for pressure control, and a development chemistry line may be coupled to the process chamber for delivery of development chemistry into the process chamber. The process chamber may include one or more heaters for temperature control, such as heaters coupled to a substrate support in the process chamber for substrate temperature control. In some embodiments, the chamber interior can be coated with corrosion resistant films, such as organic polymers or inorganic coatings. One such coating is polytetrafluoroethylene (PTFE), e.g., Teflon 1M. Such materials can be used in thermal processes of this disclosure without risk of removal by plasma exposure.

In thermal development processes, the photopatterned metal-containing EUV resist is exposed to development chemistry at a temperature that is optimized for etch selectivity between exposed and unexposed regions. Lower temperatures may increase contrast in etch selectivity while higher temperatures may decrease contrast in etch selectivity. In some embodiments, a temperature may be between about −60° C. and about 120° C., between about −20° C. and about 60° C., or between about −20° C. and about 20° C., such as about −10° C. Chamber pressure may be tuned, where chamber pressure may influence etch selectivity between exposed and unexposed regions during development. In some embodiments, the chamber pressure may be relatively low and accompanied without dilution, where the chamber pressure may be between about 0.1 mTorr and about 300 mTorr, between about 0.2 mTorr and about 100 mTorr, or between about 0.5 mTorr and about 50 mTorr. In some embodiments, the chamber pressure may be between about 20 mTorr and about 800 mTorr, or between about 20 mTorr and about 500 mTorr, such as about 300 mTorr. In some embodiments, the chamber pressure may be relatively high with high flow and accompanied by dilution, where the chamber pressure may be between about 100 Torr and about 760 Torr or between about 200 Torr and about 760 Torr. Reactant flow rate may be tuned, where reactant flow may influence etch selectivity between exposed and unexposed regions during development. In some embodiments, reactant flow may be between about 50 sccm and about 2000 sccm, between about 100 sccm and about 2000 sccm, or between about 100 sccm and about 1000 sccm, such as about 500 sccm. In instances with high flow, reactant flow may be between about 1 L and about 10 L. Duration of exposure may be tuned in the thermal development process. The duration of exposure may depend on how much resist is desired to be removed, development chemistry, amount of crosslinking in the resist, and composition and properties of the resist, among other factors. In some embodiments, duration of exposure may be between about 5 seconds and about 5 minutes, between about 10 seconds and about 3 minutes, or between about 10 seconds and about 1 minute.

Thermal development processes may expose the photopatterned metal-containing EUV resist to certain halide-containing chemistries in the vapor or liquid phase. In some embodiments, the development chemistry includes a hydrogen halide, hydrogen and halogen gas, boron trichloride, an organic halide, an acyl halide, a carbonyl halide, a thionyl halide, or mixtures thereof. A hydrogen halide can include but is not limited to HF, HCl, HBr, and HI. For example, the hydrogen halide can be HCl or HBr. Hydrogen and halogen gas can include but is not limited to hydrogen gas ($H_2$) mixed with $F_2$, $Cl_2$, $Br_2$, or $I_2$. Boron trichloride ($BCl_3$) may be used in combination with any of the aforementioned hydrogen halides or hydrogen and halogen gases. An organic halide can include but is not limited to $C_xH_yF_z$, $C_xH_yCl_z$, $C_xH_yBr_z$, and $C_xH_yI_z$, where x, y, and z are values equal to or greater than 0. An acyl halide can include but is not limited to $CH_3COF$, $CH_3COCl$, $CH_3COBr$, and $CH_3COI$. A carbonyl halide can include but is not limited to $COF_2$, $COCl_2$, $COBr_2$, and $COI_2$. A thionyl halide can include but is not limited to $SOF_2$, $SOCl_2$, $SoBr_2$, and $SOI_2$. In some embodiments, the halide-containing chemistry may be flowed with or without inert/carrier gas such as He, Ne, Ar, Xe, and $N_2$.

The thermal development process may be done without plasma. By applying a non-plasma thermal approach, productivity can be significantly improved as multiple wafers can be batch developed, at the same time in a low-cost thermal vacuum chamber/oven. However, in some embodiments, the thermal development process may be followed by exposure to plasma. Subsequent exposure to plasma may occur for desorption, descumming, smoothing, or other processing operations.

In plasma development processes, the photopatterned metal-containing EUV resist is exposed to development chemistry including radicals/ions of one or more gases. A process chamber for processing the semiconductor substrate may be a plasma-generating chamber or coupled to a plasma-generating chamber remote from the process chamber. Dry development may occur by remote plasma in some embodiments. The plasma-generating chamber may be an inductively-coupled plasma (ICP) reactor, transformer-coupled plasma (TCP) reactor, or capacitively-coupled plasma (CCP) reactor, employing equipment and techniques among those known in the art. An electromagnetic field acts on the one or more gases to produce a plasma in the plasma-generating chamber. Ions and/or radicals from the remote plasma may interact with the photopatterned metal-containing EUV resist. In some embodiments, a vacuum line is coupled to the process chamber for pressure control, and a development chemistry line may be coupled to the plasma-generating chamber for delivery of the one or more gases into the plasma-generating chamber. The process chamber may include one or more heaters for temperature control, such as heaters coupled to a substrate support in the process chamber for substrate temperature control. In some embodiments, the process chamber interior can be coated with corrosion resistant films, such as organic polymers or inorganic coatings. One such coating is polytetrafluoroethylene (PTFE), e.g., Teflon 1M. Such materials can be used in thermal processes of this disclosure without risk of removal by plasma exposure.

In plasma development processes, the photopatterned metal-containing EUV resist is exposed to remote plasma under conditions that are optimized for etch selectivity between exposed and unexposed regions. The conditions may be optimized for generating a gentle plasma, where a gentle plasma can be characterized by high pressure and low power. Chamber pressure may be tuned, where chamber pressure may influence etch selectivity between exposed and unexposed regions during development. In some embodiments, the chamber pressure may be equal to or greater than about 5 mTorr, or equal to or greater than about 15 mTorr. In some embodiments, the chamber pressure may be relatively high with high flow and accompanied by dilution, where the chamber pressure may be between about 100 Torr and about 760 Torr or between about 200 Torr and about 760 Torr. RF power levels may be tuned, where RF power may affect etch selectivity, roughness, descumming, and other characteristics of development. In some embodiments, the RF power may be equal to or less than about 1000 W, equal to or less than about 800 W, or equal to or less than about 500 W. Temperature may be tuned, where temperature may influence various aspects of development such as etch selectivity. In some embodiments, a temperature may be between about −60° C. and about 300° C., between about 0° C. and about 300° C., or between about 30° C. and about 120° C. Gas flow rate may be tuned, where gas flow may influence etch selectivity between exposed and unexposed regions during development. In some embodiments, gas flow rate is between about 50 sccm and about 2000 sccm, between about 100 sccm and about 2000 sccm, or between about 200 sccm and about 1000 sccm, such as about 500 sccm. Duration of exposure may be tuned in the plasma development process. The duration of exposure may depend on how much resist is desired to be removed, development chemistry, amount of crosslinking in the resist, and composition and properties of the resist, among other factors. In some embodiments, duration of exposure may be between about 1 second and about 50 minutes, between about 3 seconds and about 20 minutes, or between about 10 seconds and about 6 minutes.

Plasma development processes may expose the photopatterned metal-containing EUV resist to radicals of certain halide-containing gases. In some embodiments, the radicals are generated from a remote plasma source. For example, the plasma development may expose the photopatterned metal-containing EUV resist to radicals of hydrogen and halide gases generated from the remote plasma source. In some embodiments, a halide-containing gas includes a hydrogen halide, hydrogen and halogen gas, boron trichloride, an organic halide, an acyl halide, a carbonyl halide, a thionyl halide, or mixtures thereof. A hydrogen halide can include but is not limited to hydrogen fluoride (HF), hydrogen chloride (HCl), hydrogen bromide (HBr), and hydrogen iodide (HI). For example, the hydrogen halide may be HCl or HBr. Hydrogen and halogen gas can include but is not limited to hydrogen gas ($H_2$) mixed with fluorine gas ($F_2$), chlorine gas ($Cl_2$), bromine gas ($Br_2$), or iodine gas ($I_2$). An organic halide can include but is not limited to $C_xH_yF_z$, $C_xH_yCl_z$, $C_xH_yBr_z$, and $C_xH_yI_z$, where x, y, and z are values equal to or greater than 0. An acyl halide can include but is not limited to $CH_3COF$, $CH_3COCl$, $CH_3COBr$, and $CH_3COI$. A carbonyl halide can include but is not limited to $COF_2$, $COCl_2$, $COBr_2$, and $COI_2$. A thionyl halide can include but is not limited to $SOF_2$, $SOCl_2$, $SoBr_2$, and $SOI_2$.

In some embodiments, the halide-containing gas may be flowed with or without inert/carrier gas such as He, Ne, Ar, Xe, and $N_2$.

In addition or in the alternative to plasma activation, activation of the one or more gases in a dry development process may occur by photoactivation. In some embodiments, the photoactivation may be achieved by exposure to ultraviolet (UV) radiation. For example, the process chamber may include a lamp such as a UV lamp configured to generate UV radiation. Exposing the one or more gases to UV radiation may generate radicals of the one or more gases that can be used in dry development of the photopatterned metal-containing EUV resist. Exposure of the one or more gases to UV radiation may occur in a manner without exposing the photopatterned resist to UV radiation. In other words, the photopatterned resist is out-of-sight with respect to the UV lamp. Hence, the UV lamp may be remote from the process chamber or positioned in a manner that avoids exposing the photopatterned resist to UV radiation.

It will be understood that the aforementioned methods of thermal development, plasma development, and photoactivation development may be combined together. Such development methods may be applied simultaneously or sequentially. The development methods may be applied while flowing dry development chemistry in the liquid or vapor phase, where the dry development chemistry can include a compound of the formula $R_xZ_y$, where R=B, Al, Si, C, S, SO with x>0 and Z=Cl, H, Br, F, $CH_4$ and y>0. The development can result in a positive or a negative tone, in which the $R_xZ_y$ species selectively removes either the unexposed or the exposed material, leaving behind the exposed or unexposed counterpart as a mask.

As described above, etch selectivity during dry development is tunable by controlling process conditions such as temperature, pressure, gas flow, gas composition, and plasma power, among other tunable process conditions. Tuning etch selectivity in a single step or multiple steps may achieve desired patterned characteristics. In some embodiments, etch selectivity during dry development is tuned across one or more steps to influence EUV resist profile. More specifically, the amount of taper or a re-entrant angle in the EUV resist profile can be controlled by applying development chemistry of different etch selectivity over one or more steps. Descumming, photoresist reworking, curing, smoothing, and cleaning operations may also be tuned according to a tunable etch selectivity.

Figure 2A:
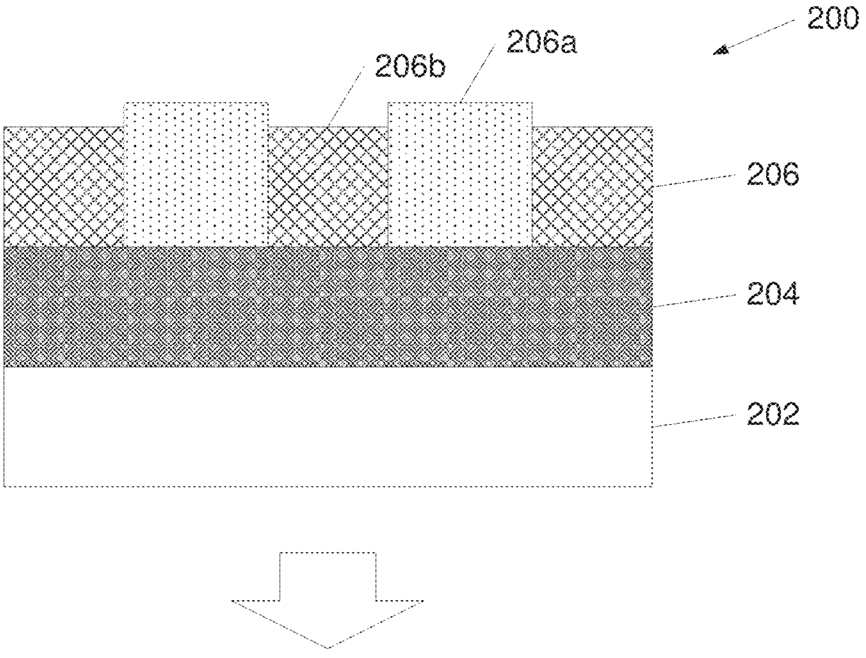
FIGS. 2A-2C show cross-sectional schematic illustrations of various processing stages of dry development according to some embodiments.
Figure 2B:
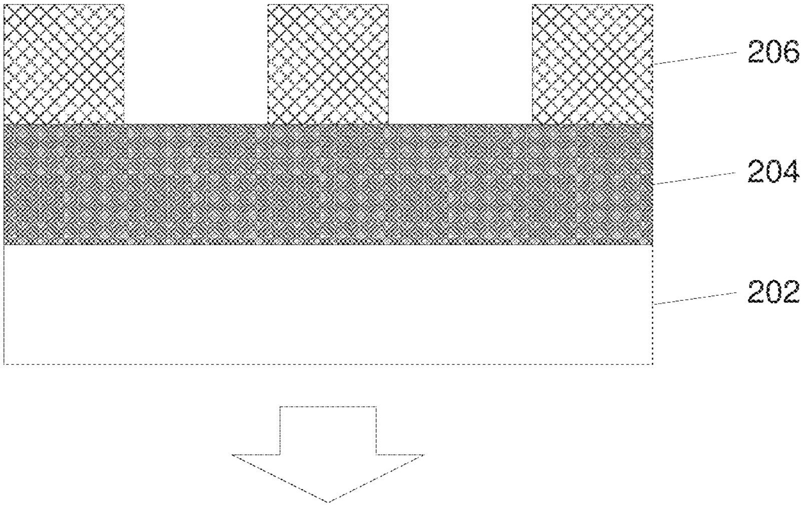
Figure 2C:
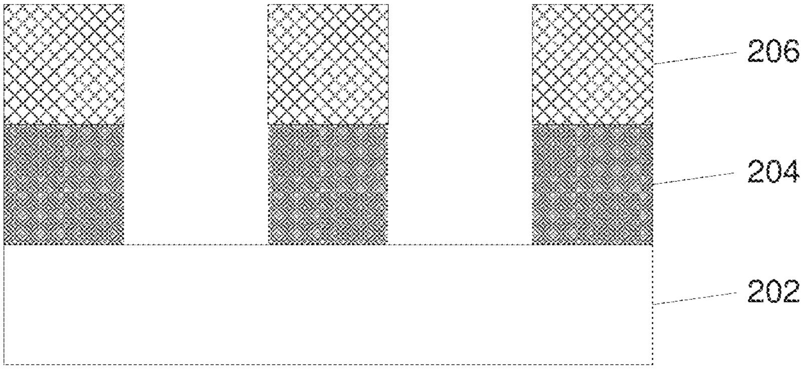

FIGS. 2A-2C show cross-sectional schematic illustrations of various processing stages of dry development according to some embodiments. The example shown in FIGS. 2A-2C illustrates negative tone dry development. As shown in FIG. 2A, a wafer 200 includes a substrate 202 and a substrate layer 204 to be etched. In some embodiments, the substrate layer 204 includes an ashable hard mask such as spin-on carbon (SoC) or other material, e.g., silicon, silicon oxide, silicon nitride, silicon carbide, etc. In some embodiments, the substrate layer 204 may be a layer stack disposed on the substrate 202. The wafer 200 further includes a photopatterned metal-containing EUV resist film 206. For example, the photopatterned metal-containing EUV resist film 206 may be an organo-metal-containing layer disposed on the substrate layer 204 to be etched. The photopatterned metal-containing EUV resist film 206 may have a thickness between about 5 nm and about 50 nm or between about 10 nm and about 30 nm. The photopatterned metal-containing EUV resist film 206 may be provided in a process chamber after photopatterning in an EUV scanner and/or after a PEB treatment as described above. The photopatterned metal-containing EUV resist film 206 includes non-EUV exposed regions 206*a* and EUV exposed regions 206*b*. As shown in FIG. 2B, the non-EUV exposed regions 206*a* of the photopatterned metal-containing EUV resist film 206 can be removed in a dry development process by exposure to flows of dry development chemistry without striking a plasma. The dry development chemistry may include a halide-containing chemistry such as a hydrogen halide or hydrogen and halogen gas. A resist mask 208 is formed after development by removal of the non-EUV exposed regions 206*a*. Thereafter, the substrate layer 204 to be etched may be etched using the resist mask 208 to provide the structure depicted in FIG. 2C.

Figure 3:
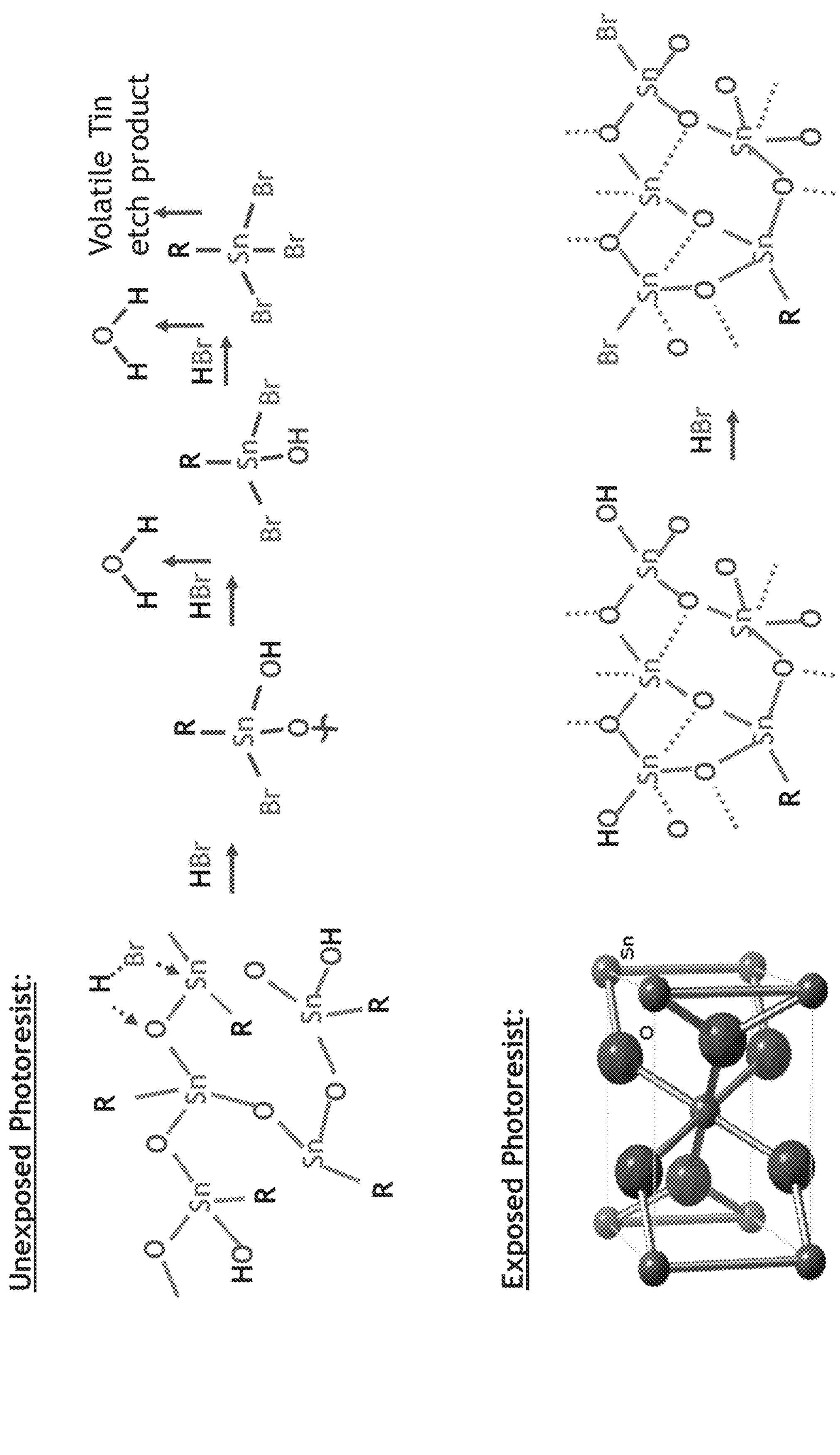
FIG. 3 illustrates an example dry development mechanism for chemical reactions of hydrogen bromide (HBr) with exposed and unexposed portions of EUV photoresist according to some embodiments.

FIG. 3 illustrates an example dry development mechanism for chemical reactions of HBr with exposed and unexposed portions of EUV photoresist according to some embodiments. FIG. 3 illustrates a possible dry development mechanism, though it will be understood that the present disclosure is not limited by any particular mechanism, function, theory, or utility. An organo-metal-oxide film may have a tetrahedrally coordinated structure. Exposed regions have higher levels of Sn—O—Sn crosslinking, resulting in higher density and lower/slower reactivity with HBr or HCl. Unexposed regions exhibit lower density due to the presence of bulky alkyl substituents which block the close approach and condensation of Sn—OH moieties. In unexposed regions, hydrogen halide more readily protonates more “basic” and accessible oxygen lone pairs characteristic of more tetrahedral-coordinated organotin oxide hydroxides. Volatile byproducts of RSnX3 (with X═Cl or Br) are rapidly generated and removed from the unexposed regions. In FIG. 3, HBr selectively protonates an oxygen lone pair to form a volatile byproduct of R—Sn—Br. Water is a byproduct as well. The speed of the reaction can be increased by removal of water. When the alkyl group is iso-propyl, at typical EUV patterning doses, at least 2 out of every 3 isopropyl substituents are removed, such that after a PEB step exposed areas condense to form a higher density more $SnO_2$ like material exhibiting lower reactivity with hydrogen halide due to adoption of a more hexacoordinate tin structure in which oxygen atoms are less accessible resulting in much slower reactivity with hydrogen halides. In FIG. 3, the exposed regions undergo a large decrease in dry etch rate linked to loss of isopropyl substituents allowing condensation to material with more/most oxygen atoms bonded to 3 (rather than 2) tin atoms markedly decreasing reaction rates with HBr or HCl.

In some instances, there may be residue or scum remaining after development. Residue may result from slower etching components in less homogeneous EUV resist formulations, including those applied by spin-coating techniques. Such scum may contain high metal concentrations, which may be problematic during subsequent pattern transfer.

Additionally or alternatively, roughness may form after development on sidewalls of etched features in a developed pattern. Some of this may be attributed to stochastics or non-optimal Gaussian distribution of the light resulting in partially or fully exposed material in areas where the resist should remain unexposed or vice versa.

In some embodiments, dry development may be accompanied by a descum/smoothing operation. In some embodiments, a descumming and smoothing operation may be an inert gas plasma desorption operation. For example, the inert gas plasma desorption operation may be a helium plasma desorption operation. The inert gas plasma desorption operation may be performed after dry development or cycled with dry development.

Figure 4A:
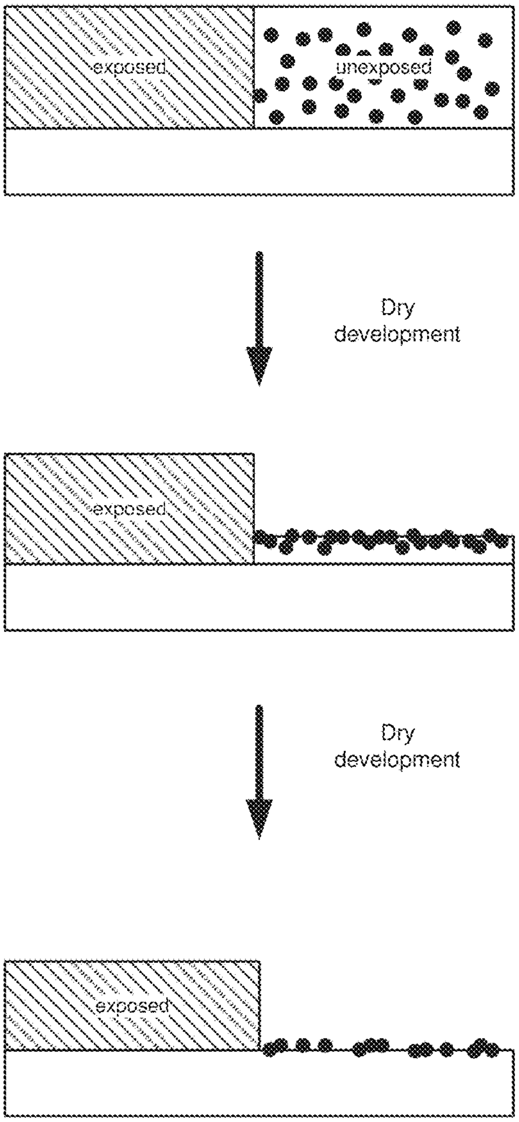
FIG. 4A shows cross-sectional schematic illustrations of dry development without applying inert gas plasma according to some embodiments.

FIG. 4A shows cross-sectional schematic illustrations of dry development without applying inert gas plasma according to some embodiments. A photopatterned metal-containing EUV resist film includes exposed and unexposed regions. As shown in FIG. 4A, particles or clusters of metal oxide (e.g., $SnO_x$) may occupy the unexposed regions. As dry development proceeds, the clusters of metal oxide become more concentrated. Clusters of metal oxide are generally difficult to remove. Development may be selective for removal of organic material. After removal of the unexposed regions, the clusters of metal oxide may remain on a surface of the substrate as scum. Clusters of metal oxide that remain on sidewalls of the exposed regions may lead to roughness.

Figure 4B:
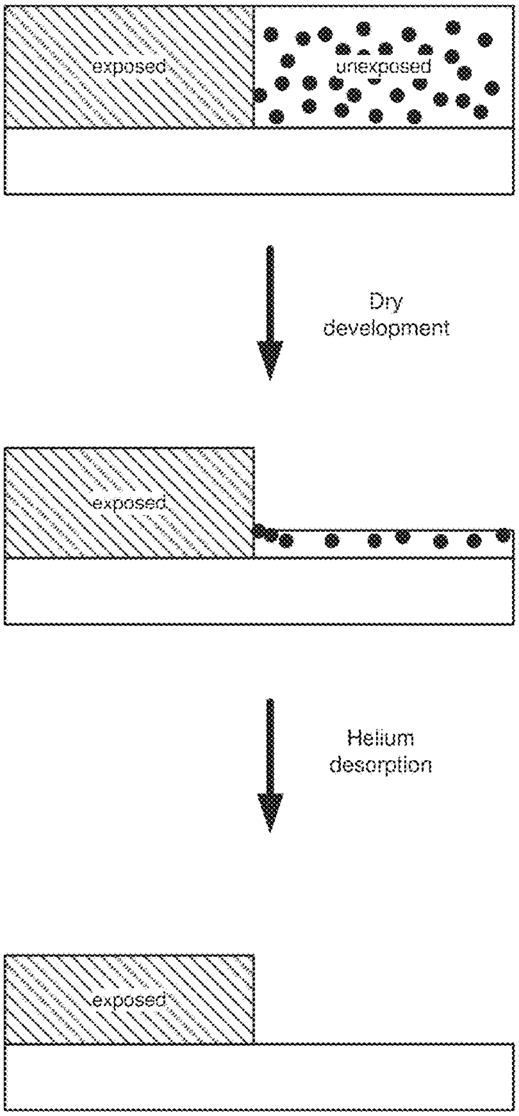
FIG. 4B shows cross-sectional schematic illustrations of dry development cycling inert gas plasma for descumming according to some embodiments.

FIG. 4B shows cross-sectional schematic illustrations of dry development cycling inert gas plasma for descumming according to some embodiments. A first phase involves dry development to remove a substantial portion of the unexposed regions of the photopatterned metal-containing EUV resist film. The dry development chemistry may include, for example, HBr. A substantial portion may represent at least more than 70 volume % of the unexposed regions, more than 80 volume % of the unexposed regions, or more than 90 volume % of the unexposed regions. Clusters of metal oxide concentrate at a surface of the remaining unexposed regions of the EUV resist film. A second phase involves applying an inert gas plasma like helium plasma with low power and high ion energy for a short duration. The helium plasma removes the clusters of metal oxides. In addition, the helium plasma removes clusters from sidewalls and smooths the sidewalls. Helium plasma treatment may also serve to help harden or cure the patterned EUV resist film to form a denser metal oxide like hard mask. After the helium plasma treatment, a less selective dry etch step can be employed to remove any residue remaining in unexposed regions of the EUV resist film.

In some embodiments, dry development may cycle with helium plasma treatment across one or more cycles until the unexposed regions of the EUV resist film are removed. The helium plasma descum/smoothing may be cycled with dry development, as described above, for enhanced results. In this way, most of the organic component of the unexposed regions, for example, of the pattern is removed by the dry development, then a short helium plasma operation can remove some of the concentrated metal at the surface, opening up access to the remaining underlying organic material, that can then be removed in a subsequent dry development operation/cycle. Another cycle of helium plasma may be used to remove any remaining metal to leave a clean and smooth feature surface. The cycling can be continued until all or substantially all the scum and roughness residue is removed to leave a clean and smooth feature surface.

Process conditions for a descumming and smoothing operations may be controlled during or after development. In some embodiments, reactant flow may be between about 50 sccm and about 1000 sccm or between about 100 sccm and about 500 sccm, such as about 500 sccm He. In some embodiments, a temperature may be between about −60° C. and about 120° C., between about −20° C. and about 60° C., or between about 20° C. and about 40° C., such as about 20° C. In some embodiments, chamber pressure may be between about 1 mTorr and about 300 mTorr, between about 5 mTorr and about 100 mTorr, between about 5 mTorr and about 20 mTorr, such as about 10 mTorr. The plasma power may be relatively low with high ion energy. In some embodiments, plasma power may be between about 50 W and about 1000 W, between about 100 W and about 500 W, or between about 100 W and about 300 W, such as about 300 W. In some embodiments, the wafer bias is between about 10 V and about 500 V, between about 50 V and about 300 V, such as about 200 V. The plasma may be generated using a high RF frequency. In some embodiments, the RF frequency is 13.56 MHz. The duration of exposure to inert gas plasma may be relatively short so as to avoid excess exposure to UV radiation during plasma exposure. In some embodiments, the duration of exposure is between about 0.5 seconds and about 5 seconds, between about 1 second and about 3 seconds, such as about 2 seconds.

The inert gas plasma treatment for descumming and cleaning of the unexposed resist residue can have the collateral benefit of curing the exposed resist to harden it, thereby enhancing its hard mask function in subsequent operations to etch the underlying substrate. This resist hardening is achieved by exposure of the EUV exposed resist to UV radiation generated by the inert gas plasma, which may be continued after the descum/smoothing is complete with the bias turned off. The inert gas plasma curing may alternatively be performed if no descum/smoothing is needed or performed.

In some embodiments, inert gas plasma desorption descum and smoothing may be used with a wet development process. Wet development has very high selectivity and has been shown to exhibit clear on/off behavior, resulting in inability of a wet development process to remove areas exposed by "stray" EUV photons. The remaining residues are then left after the wet development process, resulting in scumming and high line edge and width roughness. Interestingly, due to the tunability of the dry development process in which the etch rate and selectivity can be tuned based on multiple knobs (e.g., time, temperature, pressure, gas/flow), inert gas plasma and/or dry development can be further applied to descum and smooth-metal containing resist lines by removing these partially exposed residues.

Figure 5:
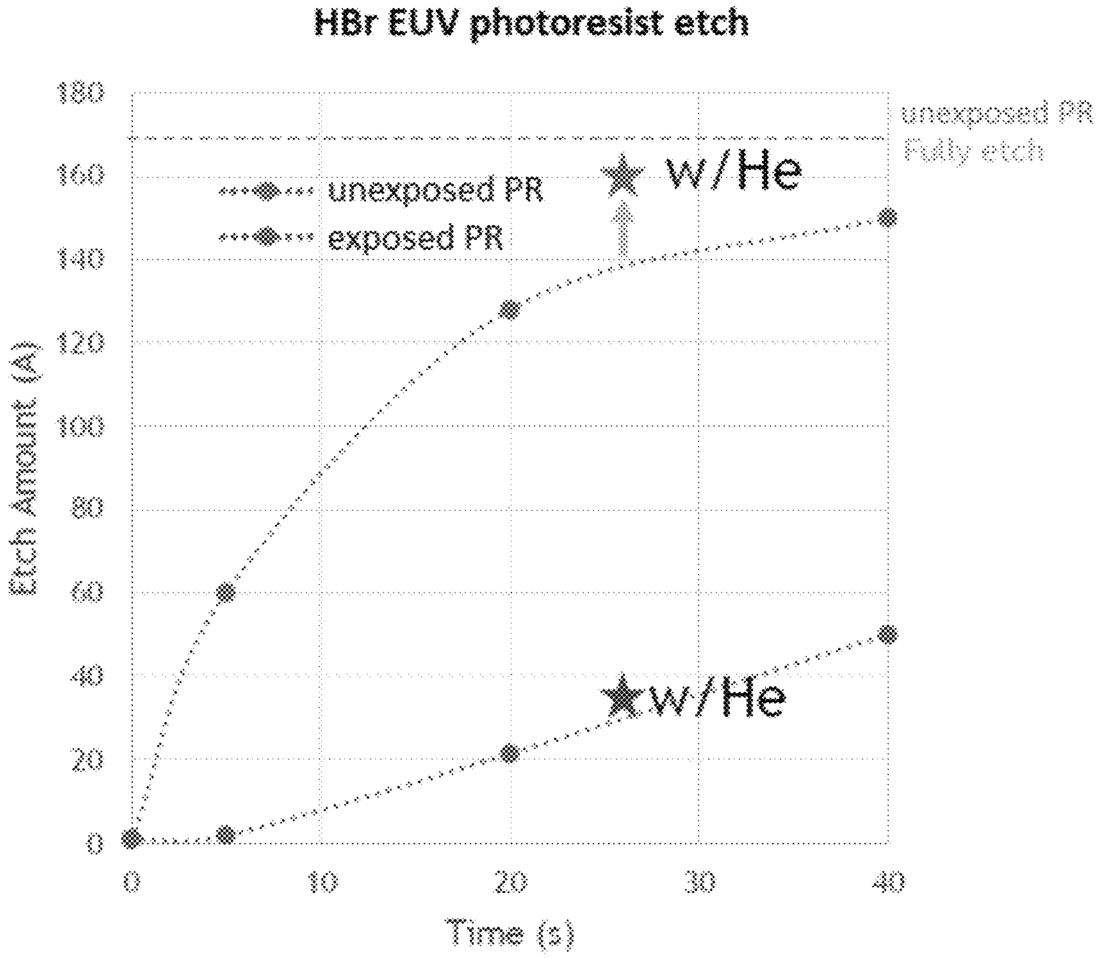
FIG. 5 shows a graph comparing etch rates between exposed and unexposed portions of EUV photoresist using helium plasma during dry development.

FIG. 5 shows a graph comparing etch rates between exposed and unexposed portions of EUV photoresist using helium plasma during dry development. The EUV photoresist may be an organotin-oxide EUV photoresist. The unexposed portions etch at a faster rate than the exposed portions. However, as dry development proceeds with HBr, the etch rate slows down. Without being limited by any theory, it is believed that the presence of tin oxide particles/clusters slow down the etch rate. By applying helium desorption, more of the unexposed portions of the EUV photoresist can be etched.

Figure 6B:
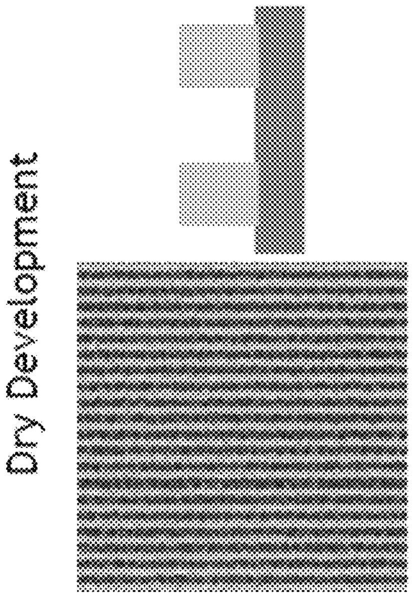
FIGS. 6A and 6B show scanning electron microscopy (SEM) images comparing wet development and dry development with respect to line collapse.
Figure 6A:
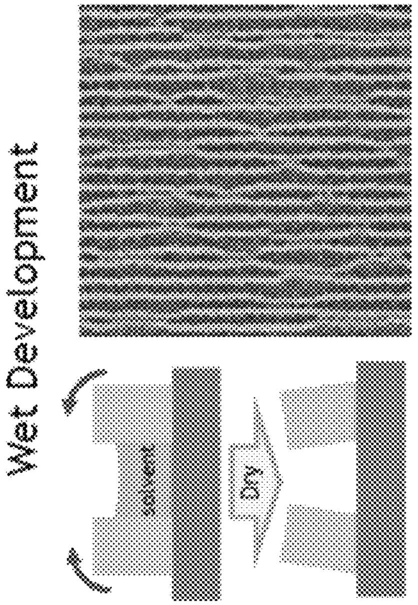

FIGS. 6A and 6B show SEM images comparing wet development and dry development with respect to line collapse. In FIG. 6A, a photopatterned metal-containing EUV resist is exposed to a wet development chemistry such as an organic solvent. After a liquid drying step, there is observed some pattern line collapse. This may be due in part to surface tension effects from capillary forces. In FIG. 6B, a photopatterned metal-containing EUV resist is exposed to dry development chemistry such as a hydrogen halide gas. Dry development by a gas phase reaction without a liquid drying step prevents pattern line collapse or delamination.

Figure 7A:
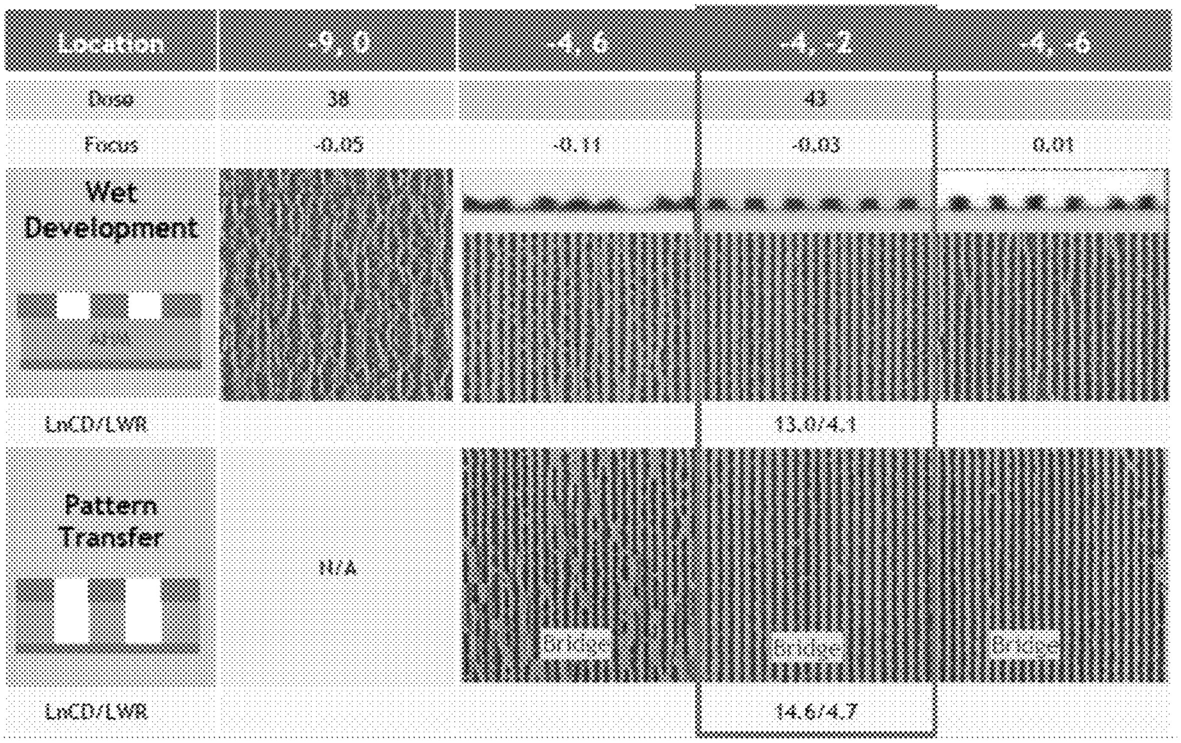
FIGS. 7A and 7B show SEM images comparing wet development and dry development with respect to roughness and critical dimension (CD) control.
Figure 7B:
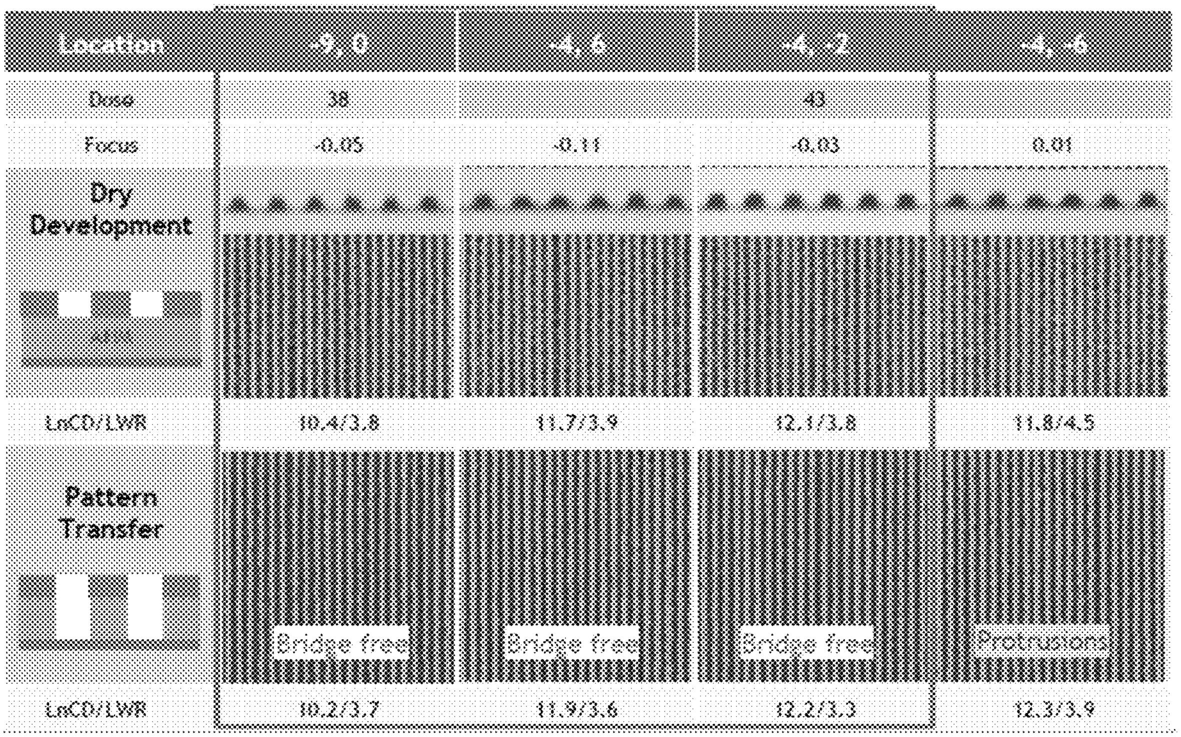

FIGS. 7A and 7B show SEM images comparing wet development and dry development with respect to roughness and critical dimension (CD) control. In FIGS. 7A and 7B, an organotin oxide film was deposited on an ashable hard mask. The organotin oxide film was EUV exposed at different doses and different depths of focus. The organotin oxide film underwent wet development in FIG. 7A and underwent dry development in FIG. 7B. The organotin oxide resist mask had a square profile after wet development while the organotin oxide resist mask had a tapered profile after dry development. Line bridging was observed after pattern transfer in wet development while no line bridging was observed after pattern transfer in dry development. Due to surface tension during solvent drying after wet development, it was observed that line collapsing and wiggling occurred at smaller line widths or lower dose. No line collapsing or wiggling occurred at smaller line widths or lower dose after dry development. With dry development, a larger process window is available for wider dose and focus range.

Figure 8:
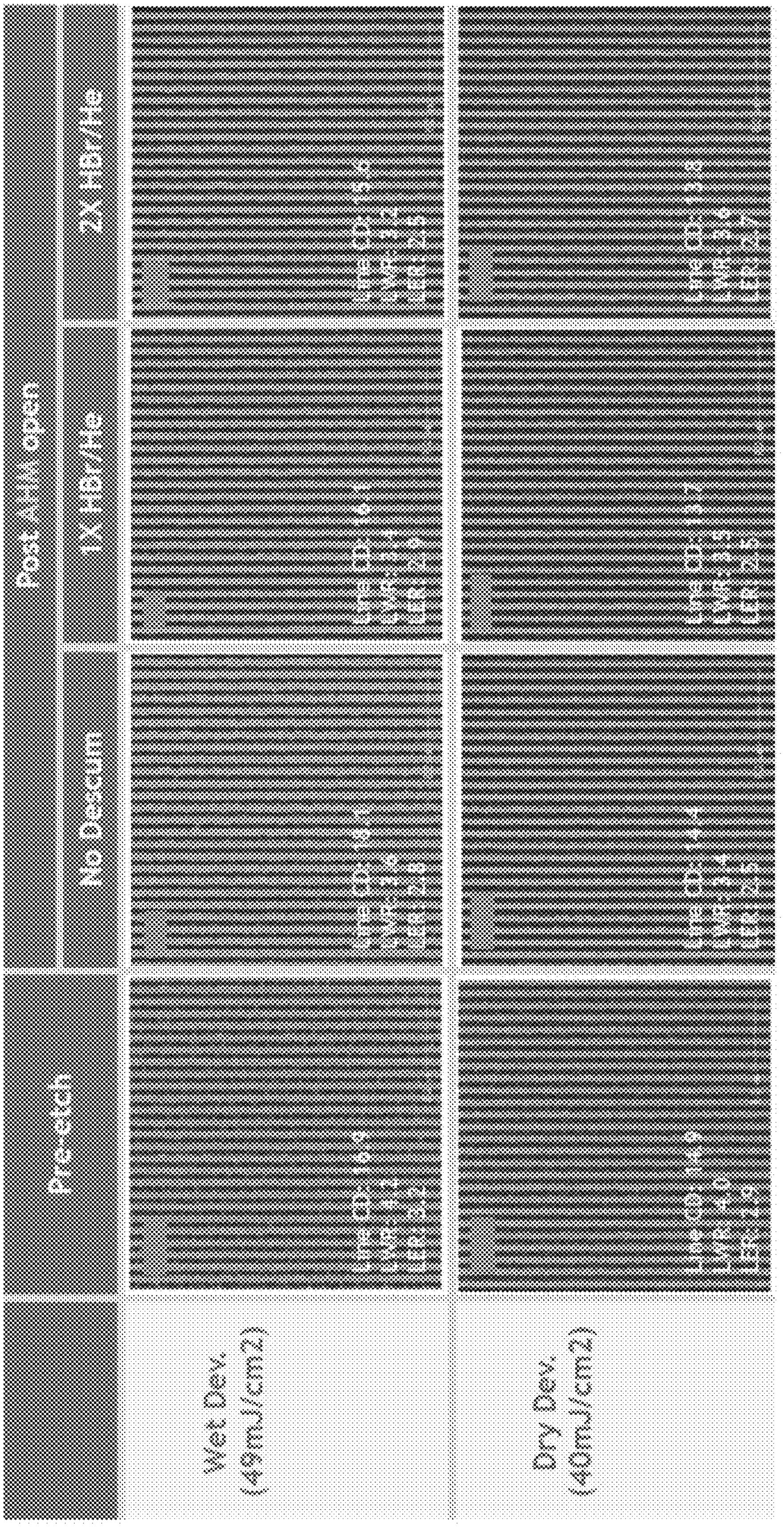
FIG. 8 shows SEM images comparing wet development and dry development with respect to scumming after hard mask opening.

FIG. 8 shows SEM images comparing wet development and dry development with respect to scumming after hard mask opening. As shown in FIG. 8, more scumming is observed after wet development compared to after dry development. Without being limited by any theory, dry development uses gas chemicals containing no oxygen or moisture oxidation source that prevents metal-oxide cross-linking of unexposed EUV resist, thereby preventing scum formation. The scum is similar to exposed EUV resist with metal-oxide cross-linking. In FIG. 8, descumming and smoothing operations may be performed after wet development or dry development.

Figure 9A:
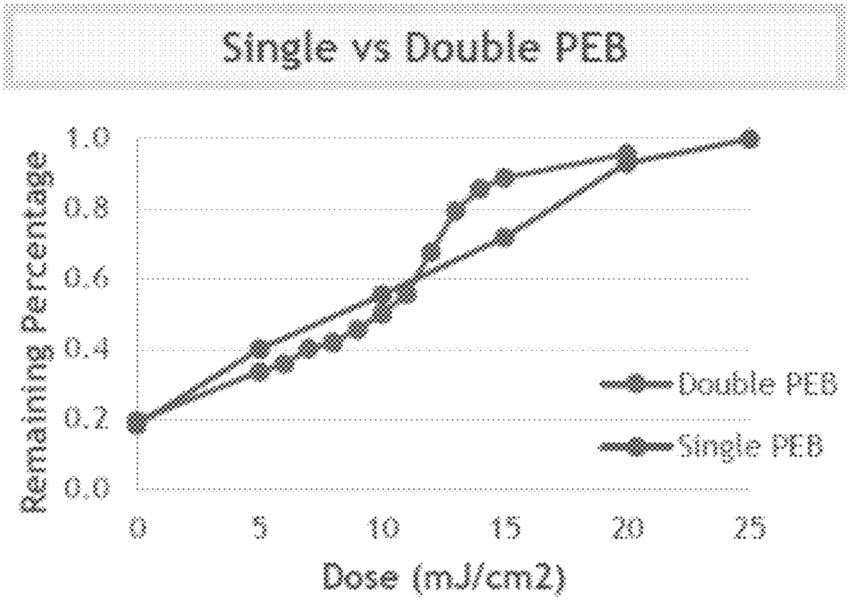
FIGS. 9A and 9B show graphs illustrating the effects of a second post-exposure bake operation on selectivity of dry development with varying pressures and temperatures.
Figure 9B:
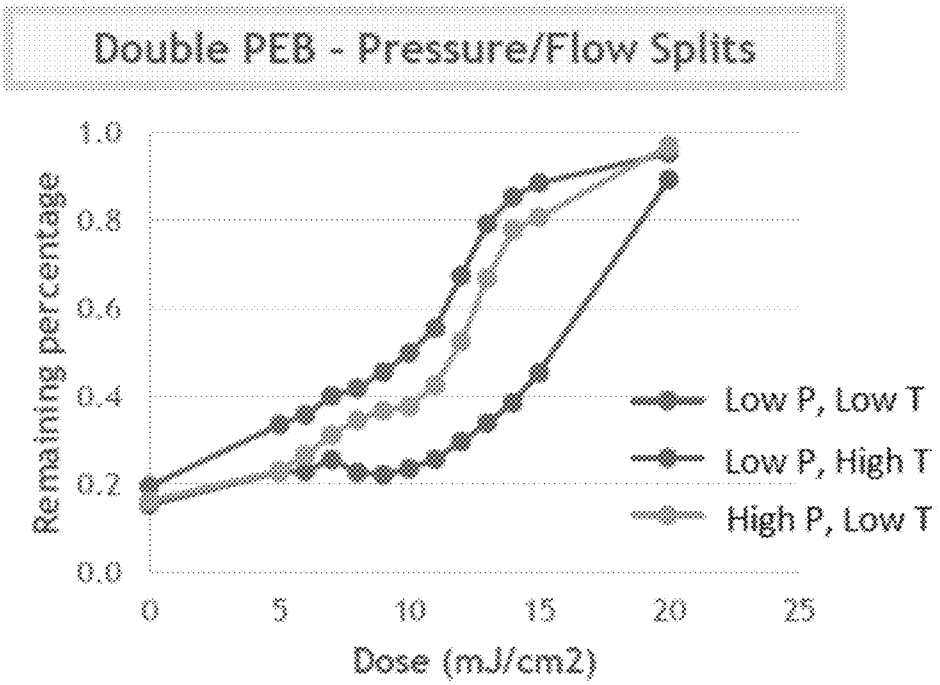

FIGS. 9A and 9B show graphs illustrating the effects of a second post-exposure bake operation on selectivity of dry development with varying pressures and temperatures. As shown in FIG. 9A, a second post-exposure bake exhibits improved etch selectivity. As shown in FIG. 9B, etch selectivity improves at a lower temperature during dry development. In addition, etch selectivity improves at lower pressures during dry development.

Figure 10:
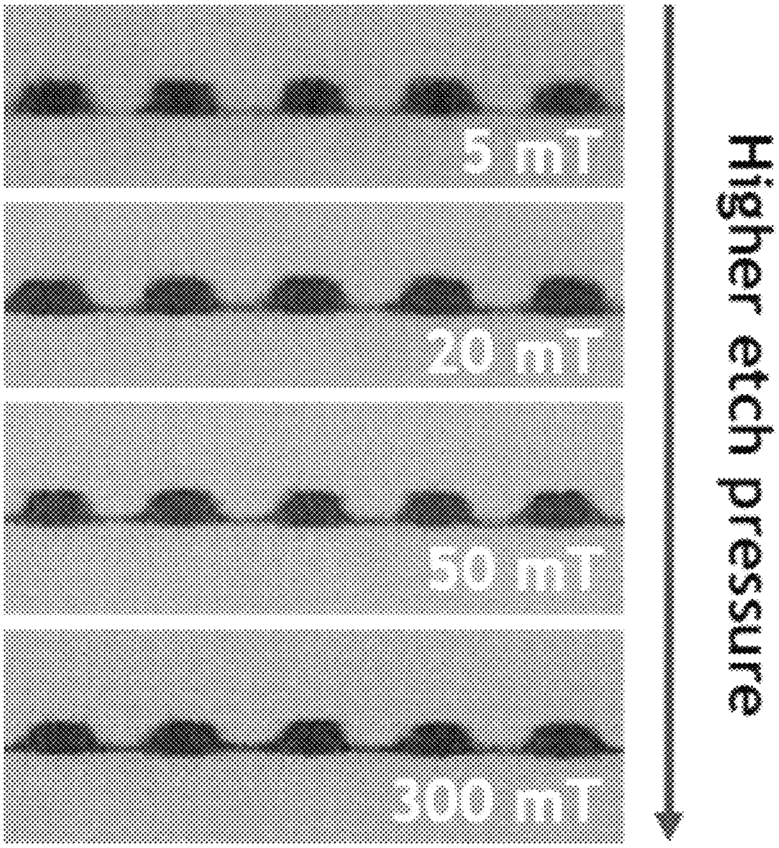
FIG. 10 shows SEM images illustrating the effects of pressure on EUV resist profiles.

FIG. 10 shows SEM images illustrating the effects of pressure on EUV resist profiles. For dry development, changes in pressure affect EUV resist profiles. Generally, higher pressures enable higher etch rates. However, lower pressures demonstrated improved EUV resist profiles. Lower pressure in FIG. 10 resulted in straighter EUV resist profiles.

Figure 11A:
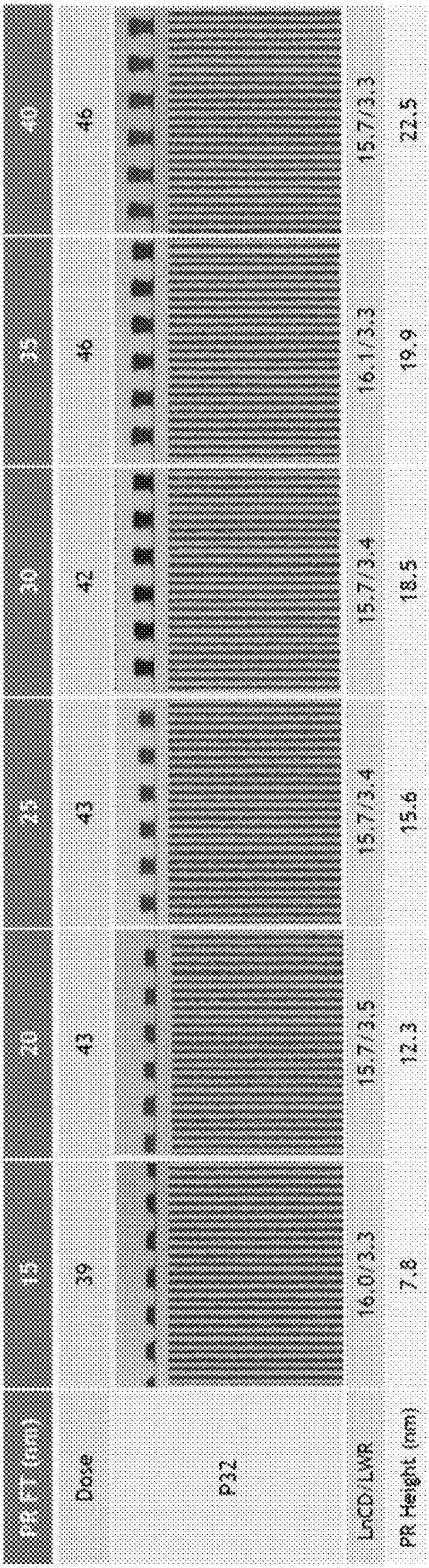
FIGS. 11A and 11B show SEM images of EUV resists at different pitches of line/space and different thicknesses.
Figure 11B:
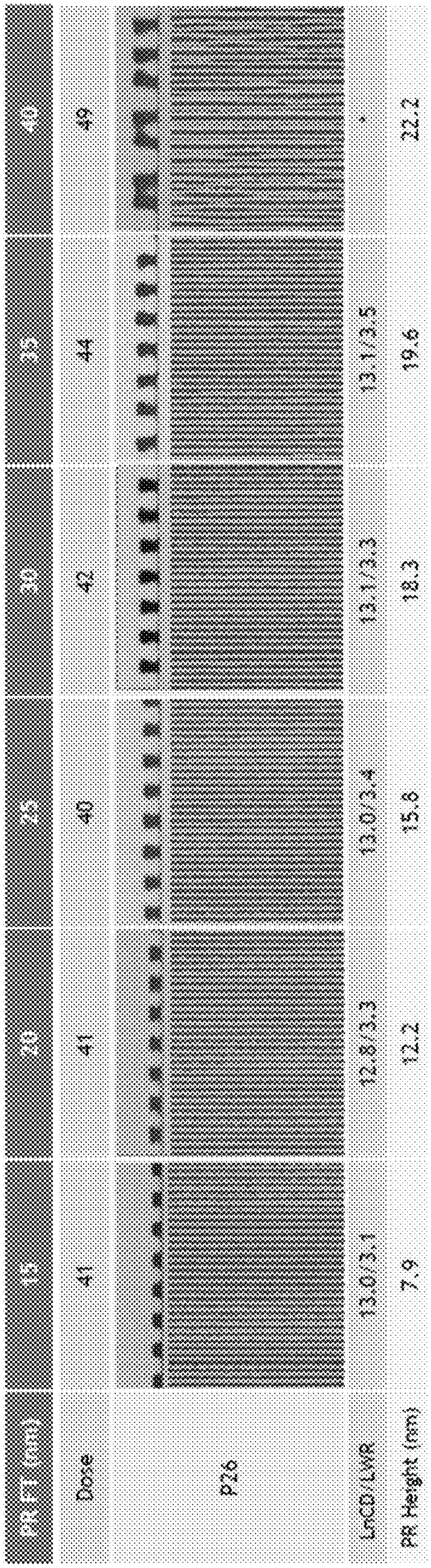

FIGS. 11A and 11B show SEM images of EUV resists at different pitches of line/space and different thicknesses. EUV resist masks were developed with 32-nm pitch and 26-nm pitch. Film thickness prior to development was between 15 nm and 40 nm. For 32-nm pitch, the EUV resist mask thicknesses ranged from 7.8 nm to 22.5 nm after development. No wiggling was observed. For 26-nm pitch, the EUV resist mask thicknesses ranged from 7.9 nm to 22.2 nm after development. Some wiggling was observed for film thicknesses equal to or greater than 30 nm due to undercut at resist bottom.

Apparatus

An apparatus of the present disclosure is configured for development of EUV resist. The apparatus may be configured to perform other processing operations such as deposition, bevel and backside cleaning, post-application baking, EUV scanning, post-exposure baking, photoresist reworking, descum, smoothing, curing, and other operations. In some embodiments, the apparatus is configured to perform all dry operations. In some embodiments, the apparatus is configured to perform all wet operations. In some embodiments, the apparatus is configured to perform a combination of wet and dry operations. The apparatus may include a single wafer chamber or multiple stations in the same process chamber. With multiple stations in the same process chamber, various processing operations such as those described in the present disclosure may be performed in different stations in the same process chamber. For instance, PEB thermal treatment may be performed in one station and development in another station.

The apparatus configured for development of EUV resist includes a process chamber with a substrate support. The apparatus may include a vacuum line coupled to the process chamber for pressure control and a development chemistry line coupled to the process chamber for delivery of development chemistry. In some embodiments, the development chemistry includes halide-containing gases or radicals of halide-containing gases. In some embodiments, the process chamber is a plasma-generating chamber or coupled to a plasma-generating chamber that functions as a remote plasma source. The plasma-generating chamber may be an ICP, TCP, or CCP reactor. The apparatus may include one or more heaters for temperature control. Such heaters may be provided in the process chamber and/or in the substrate support.

In some embodiments, the process chamber interior is coated with corrosion-resistant films, such as polymers or inorganic coatings. In one example, the process chamber interior is coated with anodized alumina. In another example, the process chamber interior is coated with yttrium oxide ($Y_2O_3$).

In some embodiments, the process chamber is made of an inexpensive material such as plastic. The process chamber does not have to necessarily be made of metal or ceramic. The plastic material may be sufficient to withstand halide-containing chemistries during development. Vacuum lines and/or development chemistry lines may be coupled to a plastic chamber.

In some embodiments, the substrate support may be used to process a substrate using a temperature distribution having radial and azimuthal components. The substrate support may include a plurality of independently controllable temperature control zones arranged in proximity to substrate locations above the temperature control zones. This allows the one or more heaters in a substrate support to more precisely and locally control temperature. The temperature control zones may be arranged in a defined pattern such as a rectangular grid, hexagonal grid, or other suitable pattern for generating a temperature profile as desired. In some embodiments, the temperature control zones may be spatially arranged in an electrostatic chuck to correct azimuthal non-uniformity or localized CD non-uniformity.

In some embodiments, the apparatus may further include a showerhead for delivery of one or more gases into the process chamber. In some embodiments, the showerhead may supply multiple separate gases to a reaction area while keeping the gases largely segregated within the showerhead. The showerhead may include multiple plenum volumes. This permits segregation of precursor gases, carrier gases, development gases, and cleaning gases, among other chemistries.

Removal of water or moisture from the process chamber may speedup the reaction of a photopatterned metal-containing EUV resist with development chemistry. In some embodiments, a cold trap may be coupled to the process chamber for removal of byproduct water vapor. The cold trap may condense the byproduct water vapor into liquid or solid form.

In some embodiments, the apparatus may further include a UV source such as a UV lamp and/or an IR source such as an IR lamp for resist curing and dehalogenation. The UV source and/or IR source may provide exposure to radiation to cure the EUV resist. Additionally or alternatively, the UV source may assist in photoactivation of development chemistries. Additionally or alternatively, the UV source may assist in halogen removal. Halogen residues may form on the semiconductor substrate or chamber surfaces that can be removed by UV exposure.

Figure 12:
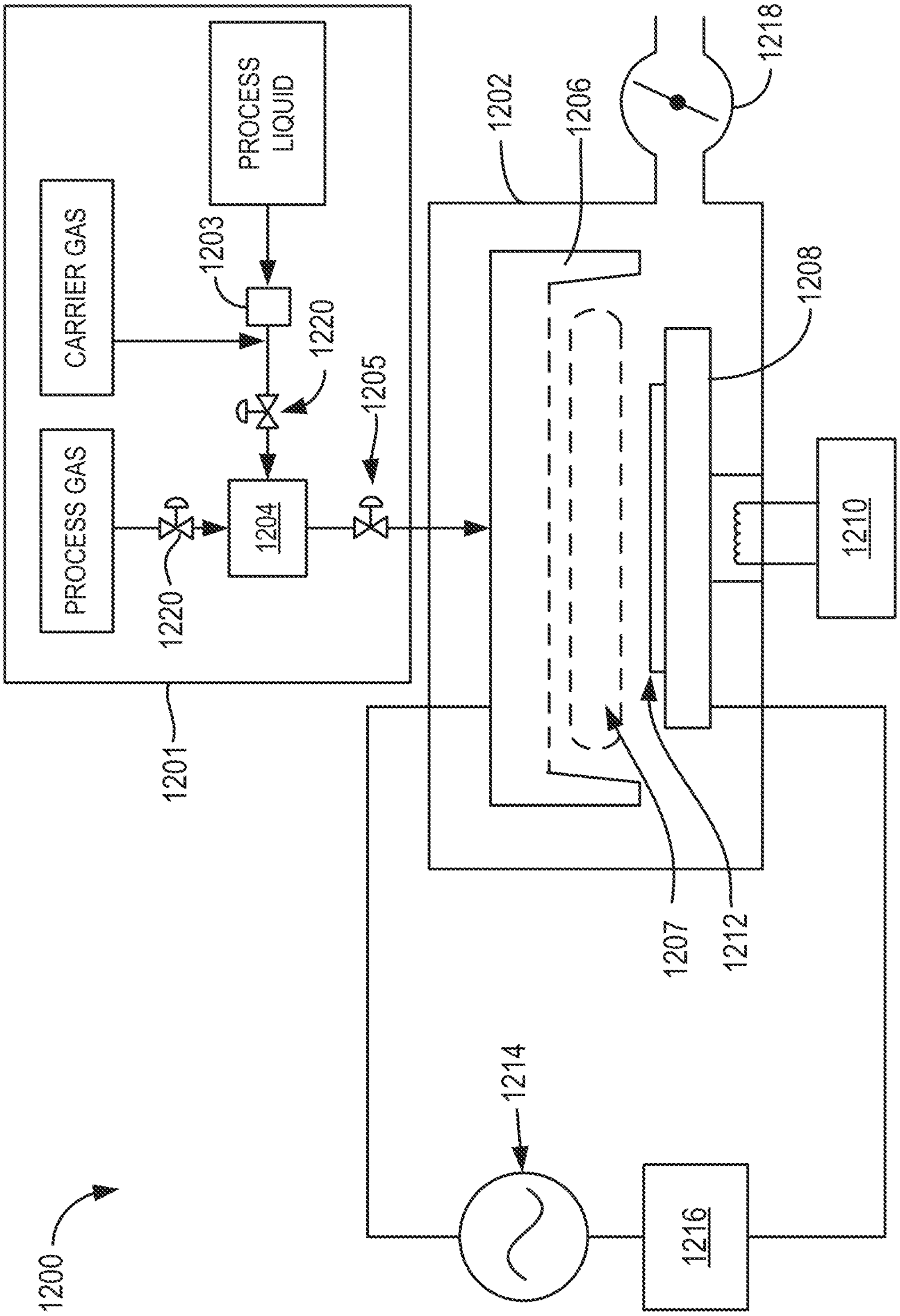
FIG. 12 depicts a schematic illustration of an example process station for maintaining a low-pressure environment that is suitable for performing development, clean, rework, descum, and smoothing operations according to some embodiments.
Figure 13:
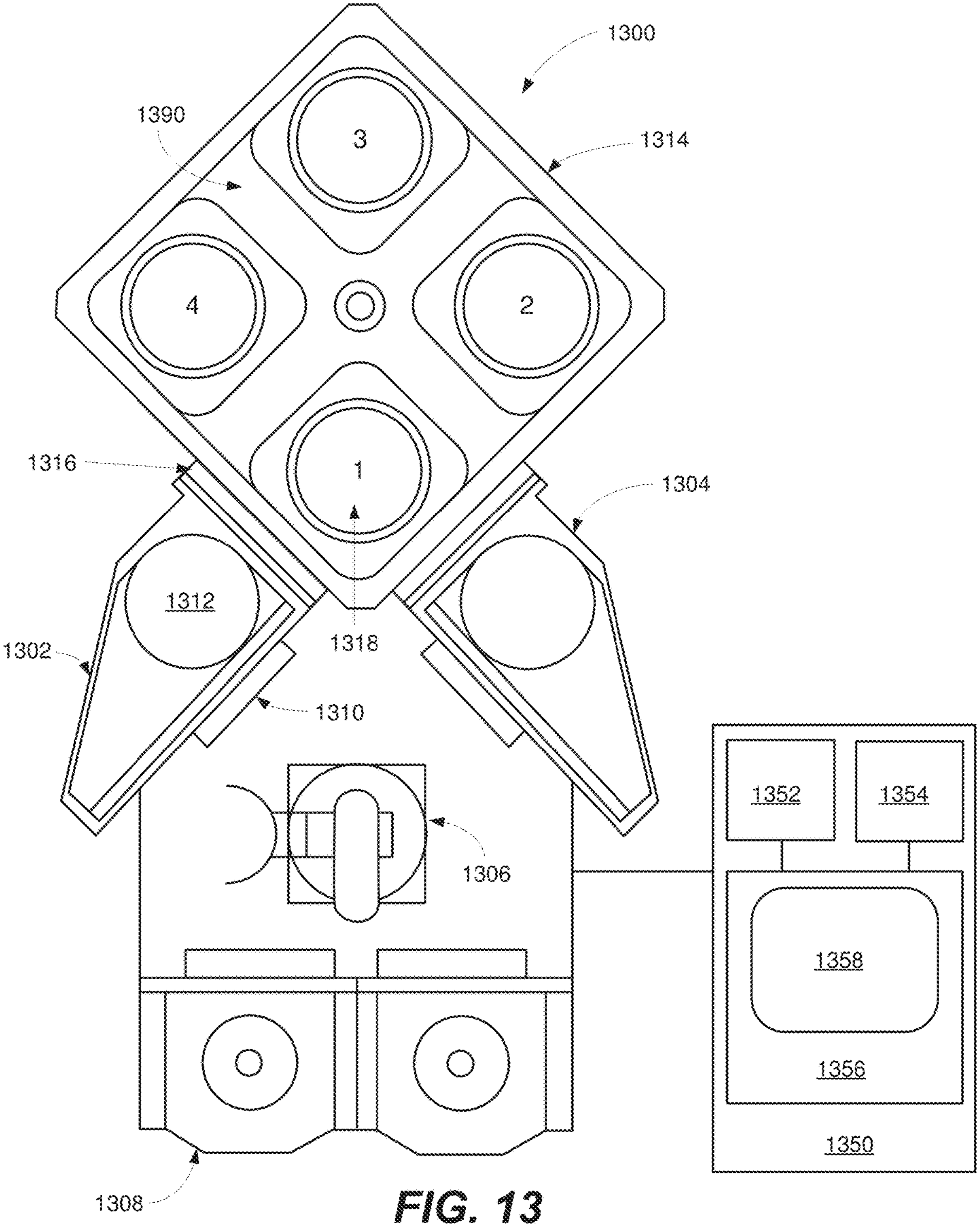
FIG. 13 depicts a schematic illustration of an example multi-station processing tool suitable for implementation of various development, clean, rework, descum, and smoothing operations described herein.

FIG. 12 depicts a schematic illustration of an embodiment of process station 1200 having a process chamber body 1202 for maintaining a low-pressure environment that is suitable for embodiment of described dry development, clean, rework, descum and smoothing embodiments. A plurality of process stations 1200 may be included in a common low-pressure process tool environment. For example, FIG. 13 depicts an embodiment of a multi-station processing tool 1300, such as a VECTOR® processing tool available from Lam Research Corporation, Fremont, CA. In some embodiments, one or more hardware parameters of the process station 1200 including those discussed in detail below may be adjusted programmatically by one or more computer controllers 1250.

A process station may be configured as a module in a cluster tool. FIG. 15 depicts a semiconductor process cluster tool architecture with vacuum-integrated deposition and patterning modules suitable for implementation of the embodiments described herein. Such a cluster process tool architecture can include resist deposition, resist exposure (EUV scanner), resist development and etch modules, as described above and further below with reference to FIGS. 14 and 15.

In some embodiments, certain of the processing functions can be performed consecutively in the same module, for example dry development and etch. And embodiments of this disclosure are directed to methods and apparatus for receiving a wafer, including a photopatterned EUV resist thin film layer disposed on a layer or layer stack to be etched, to a dry development/etch chamber following photopatterning in an EUV scanner; dry developing photopatterned EUV resist thin film layer; and then etching the underlying layer using the patterned EUV resist as a mask, as described herein.

Returning to FIG. 12, process station 1200 fluidly communicates with reactant delivery system 1201*a* for delivering process gases to a distribution showerhead 1206. Reactant delivery system 1201*a* optionally includes a mixing vessel 1204 for blending and/or conditioning process gases, for delivery to showerhead 1206. One or more mixing vessel inlet valves 1220 may control introduction of process gases to mixing vessel 1204. Where plasma exposure is used, plasma may also be delivered to the showerhead 1206 or may be generated in the process station 1200. As noted above, in at least some embodiments, non-plasma thermal exposure is favored.

FIG. 12 includes an optional vaporization point 1203 for vaporizing liquid reactant to be supplied to the mixing vessel 1204. In some embodiments, a liquid flow controller (LFC) upstream of vaporization point 1203 may be provided for controlling a mass flow of liquid for vaporization and delivery to process station 1200. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM.

Showerhead 1206 distributes process gases toward substrate 1212. In the embodiment shown in FIG. 12, the substrate 1212 is located beneath showerhead 1206 and is shown resting on a pedestal 1208. Showerhead 1206 may have any suitable shape, and may have any suitable number and arrangement of ports for distributing process gases to substrate 1212.

In some embodiments, pedestal 1208 may be raised or lowered to expose substrate 1212 to a volume between the substrate 1212 and the showerhead 1206. It will be appreciated that, in some embodiments, pedestal height may be adjusted programmatically by a suitable computer controller 1250. In some embodiments, the showerhead 1206 may have multiple plenum volumes with multiple temperature controls.

In some embodiments, pedestal 1208 may be temperature controlled via heater 1210. In some embodiments, the pedestal 1208 may be heated to a temperature of greater than 0° C. and up to 300° C. or more, for example 50 to 120° C., such as about 65 to 80° C., during non-plasma thermal exposure of a photopatterned resist to hydrogen halide dry development chemistry, such as HBr or HCl, as described in disclosed embodiments. In some embodiments, the heater 1210 of the pedestal 1208 may include a plurality of independently controllable temperature control zones.

Further, in some embodiments, pressure control for process station 1200 may be provided by a butterfly valve 1218. As shown in the embodiment of FIG. 12, butterfly valve 1218 throttles a vacuum provided by a downstream vacuum pump (not shown). However, in some embodiments, pressure control of process station 1200 may also be adjusted by varying a flow rate of one or more gases introduced to the process station 1200.

In some embodiments, a position of showerhead 1206 may be adjusted relative to pedestal 1208 to vary a volume between the substrate 1212 and the showerhead 1206. Further, it will be appreciated that a vertical position of pedestal 1208 and/or showerhead 1206 may be varied by any suitable mechanism within the scope of the present disclosure. In some embodiments, pedestal 1208 may include a rotational axis for rotating an orientation of substrate 1212. It will be appreciated that, in some embodiments, one or more of these example adjustments may be performed programmatically by one or more suitable computer controllers 1250.

Where plasma may be used, for example in gentle plasma-based dry development embodiments and/or etch operations conducted in the same chamber, showerhead 1206 and pedestal 1208 electrically communicate with a radio frequency (RF) power supply 1214 and matching network 1216 for powering a plasma. In some embodiments, the plasma energy may be controlled by controlling one or more of a process station pressure, a gas concentration, an RF source power, an RF source frequency, and a plasma power pulse timing. For example, RF power supply 1214 and matching network 1216 may be operated at any suitable power to form a plasma having a desired composition of radical species. Examples of suitable powers are up to about 500 W.

In some embodiments, instructions for a controller 1250 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a recipe phase may include instructions for setting a flow rate of a dry development chemistry reactant gas, such as HBr or HCl, and time delay instructions for the recipe phase. In some embodiments, the controller 1250 may include any of the features described below with respect to system controller 1350 of FIG. 13.

As described above, one or more process stations may be included in a multi-station processing tool. FIG. 13 shows a schematic view of an embodiment of a multi-station processing tool 1300 with an inbound load lock 1302 and an outbound load lock 1304, either or both of which may include a remote plasma source. A robot 1306 at atmospheric pressure is configured to move wafers from a cassette loaded through a pod 1308 into inbound load lock 1302 via an atmospheric port 1310. A wafer is placed by the robot 1306 on a pedestal 1312 in the inbound load lock 1302, the atmospheric port 1310 is closed, and the load lock is pumped down. Where the inbound load lock 1302 includes a remote plasma source, the wafer may be exposed to a remote plasma treatment to treat the silicon nitride surface in the load lock prior to being introduced into a processing chamber 1314. Further, the wafer also may be heated in the inbound load lock 1302 as well, for example, to remove moisture and adsorbed gases. Next, a chamber transport port 1316 to processing chamber 1314 is opened, and another robot (not shown) places the wafer into the reactor on a pedestal of a first station shown in the reactor for processing. While the embodiment depicted in FIG. 13 includes load locks, it will be appreciated that, in some embodiments, direct entry of a wafer into a process station may be provided.

The depicted processing chamber 1314 includes four process stations, numbered from 1 to 4 in the embodiment shown in FIG. 13. Each station has a heated pedestal (shown at 1318 for station 1), and gas line inlets. It will be appreciated that in some embodiments, each process station may have different or multiple purposes. For example, in some embodiments, a process station may be switchable between dry development and etch process modes. Additionally or alternatively, in some embodiments, processing chamber 1314 may include one or more matched pairs of dry development and etch process stations. While the depicted processing chamber 1314 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 13 depicts an embodiment of a wafer handling system 1390 for transferring wafers within processing chamber 1314. In some embodiments, wafer handling system 1390 may transfer wafers between various process stations and/or between a process station and a load lock. It will be appreciated that any suitable wafer handling system may be employed. Non-limiting examples include wafer carousels and wafer handling robots. FIG. 13 also depicts an embodiment of a system controller 1350 employed to control process conditions and hardware states of process tool 1300. System controller 1350 may include one or more memory devices 1356, one or more mass storage devices 1354, and one or more processors 1352. Processor 1352 may include a CPU or computer, analog, and/or digital input/output connections, stepper motor controller boards, etc.

In some embodiments, system controller 1350 controls all of the activities of process tool 1300. System controller 1350 executes system control software 1358 stored in mass storage device 1354, loaded into memory device 1356, and executed on processor 1352. Alternatively, the control logic may be hard coded in the controller 1350. Applications Specific Integrated Circuits, Programmable Logic Devices (e.g., field-programmable gate arrays, or FPGAs) and the like may be used for these purposes. In the following discussion, wherever “software” or “code” is used, functionally comparable hard coded logic may be used in its place. System control software 1358 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 1300. System control software 1358 may be configured in any suitable way. For example, various process tool component subroutines or control objects may be written to control operation of the process tool components used to carry out various process tool processes. System control software 1358 may be coded in any suitable computer readable programming language.

In some embodiments, system control software 1358 may include input/output control (IOC) sequencing instructions for controlling the various parameters described above. Other computer software and/or programs stored on mass storage device 1354 and/or memory device 1356 associated with system controller 1350 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 1318 and to control the spacing between the substrate and other parts of process tool 1300.

A process gas control program may include code for controlling halide-containing gas composition (e.g., HBr or HCl gas as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 1350. The user interface may include a display screen, graphical software displays of the apparatus and/or process conditions, and user input devices such as pointing devices, keyboards, touch screens, microphones, etc.

In some embodiments, parameters adjusted by system controller 1350 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 1350 from various process tool sensors. The signals for controlling the process may be output on the analog and digital output connections of process tool 1300. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 1350 may provide program instructions for implementing the above-described deposition processes. The program instructions may control a variety of process parameters, such as DC power level, RF bias power level, pressure, temperature, etc. The instructions may control the parameters to operate development and/or etch processes according to various embodiments described herein.

The system controller 1350 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 1350.

In some embodiments, the system controller 1350 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the “controller,” which may control various components or subparts of the system or systems. The system controller 1350, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 1350 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 1350 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 1350, in some embodiments, may be a part of or coupled to a computer that is integrated with, coupled to the system, otherwise networked to the system, or a combination thereof. For example, the system controller 1350 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 1350 receives instructions in the form of data, which specify parameters for each of the processing steps to be performed during one or more operations. It should be understood that the parameters may be specific to the type of process to be performed and the type of tool that the system controller 1350 is configured to interface with or control. Thus as described above, the system controller 1350 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, an EUV lithography chamber (scanner) or module, a development chamber or module, and any other semiconductor processing systems that may be associated or used in the fabrication and/or manufacturing of semiconductor wafers.

As noted above, depending on the process step or steps to be performed by the tool, the system controller 1350 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Inductively coupled plasma (ICP) reactors which, in certain embodiments, may be suitable for etch operations suitable for implementation of some embodiments, are now described. Although ICP reactors are described herein, in some embodiments, it should be understood that capacitively coupled plasma reactors may also be used.

Figure 14:
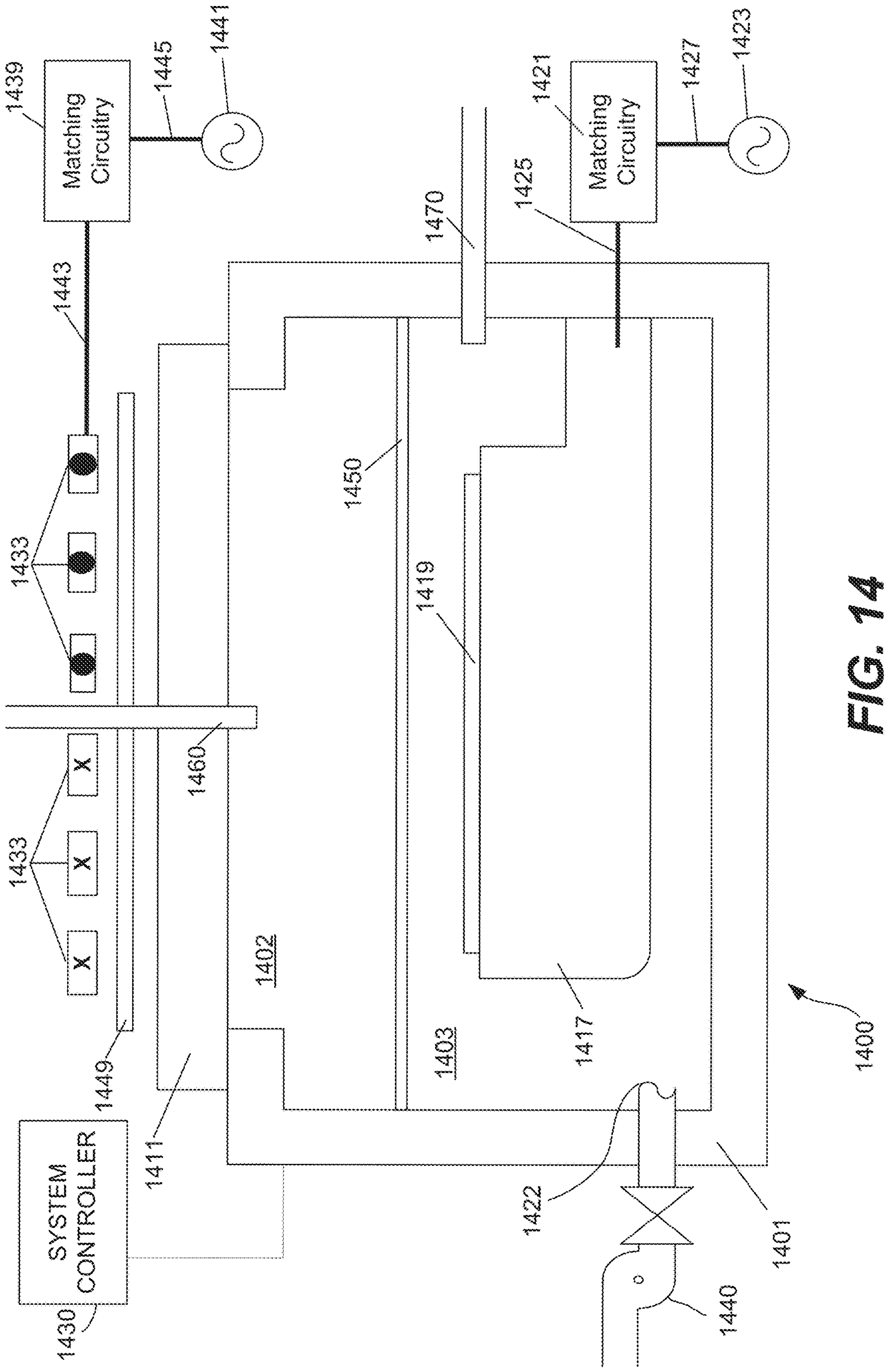
FIG. 14 shows a cross-sectional schematic view of an example inductively-coupled plasma apparatus for implementing certain embodiments and operations described herein.
Figure 15:
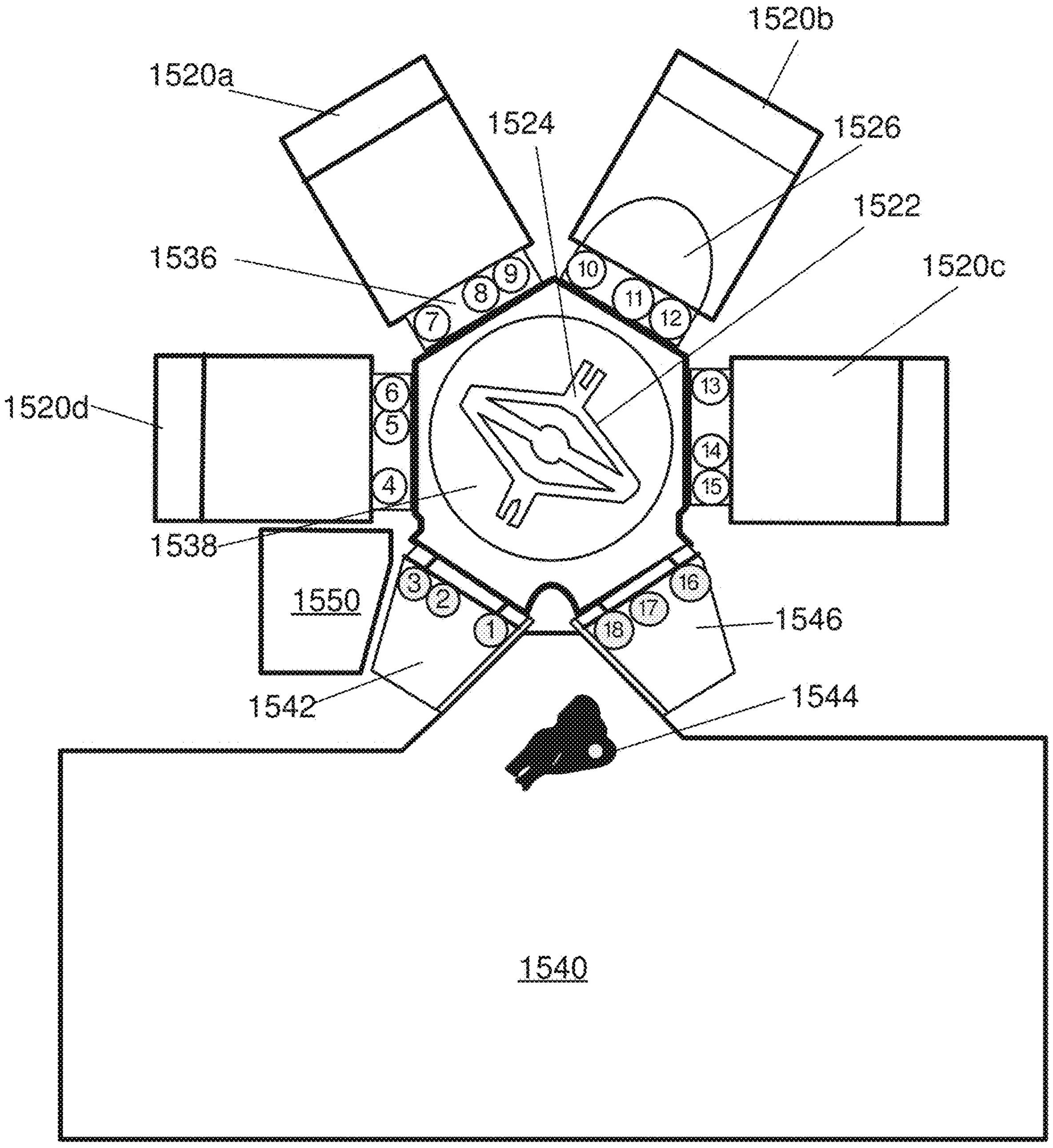
FIG. 15 depicts a semiconductor process cluster tool architecture with vacuum-integrated deposition and patterning modules that interface with a vacuum transfer module, suitable for implementations of processes described herein.

FIG. 14 schematically shows a cross-sectional view of an inductively coupled plasma apparatus 1400 appropriate for implementing certain embodiments or aspects of embodiments such as dry development and/or etch, an example of which is a Kiyo® reactor, produced by Lam Research Corp. of Fremont, CA. In other embodiments, other tools or tool types having the functionality to conduct the dry development and/or etch processes described herein may be used for implementation.

The inductively coupled plasma apparatus 1400 includes an overall process chamber 1424 structurally defined by chamber walls 1401 and a window 1411. The chamber walls 1401 may be fabricated from stainless steel, aluminum, or plastic. The window 1411 may be fabricated from quartz or other dielectric material. An optional internal plasma grid 1450 divides the overall process chamber into an upper sub-chamber 1402 and a lower sub chamber 1403. In most embodiments, plasma grid 1450 may be removed, thereby utilizing a chamber space made of sub chambers 1402 and 1403. A chuck 1417 is positioned within the lower sub-chamber 1403 near the bottom inner surface. The chuck 1417 is configured to receive and hold a semiconductor wafer 1419 upon which the etching and deposition processes are performed. The chuck 1417 can be an electrostatic chuck for supporting the wafer 1419 when present. In some embodiments, an edge ring (not shown) surrounds chuck 1417, and has an upper surface that is approximately planar with a top surface of the wafer 1419, when present over chuck 1417. The chuck 1417 also includes electrostatic electrodes for chucking and dechucking the wafer 1419. A filter and DC clamp power supply (not shown) may be provided for this purpose. Other control systems for lifting the wafer 1419 off the chuck 1417 can also be provided. The chuck 1417 can be electrically charged using an RF power supply 1423. The RF power supply 1423 is connected to matching circuitry 1421 through a connection 1427. The matching circuitry 1421 is connected to the chuck 1417 through a connection 1425. In this manner, the RF power supply 1423 is connected to the chuck 1417. In various embodiments, a bias power of the electrostatic chuck may be set at about 50V or may be set at a different bias power depending on the process performed in accordance with disclosed embodiments. For example, the bias power may be between about 20 Vb and about 100 V, or between about 30 V and about 150 V.

Elements for plasma generation include a coil 1433 is positioned above window 1411. In some embodiments, a coil is not used in disclosed embodiments. The coil 1433 is fabricated from an electrically conductive material and includes at least one complete turn. The example of a coil 1433 shown in FIG. 14 includes three turns. The cross sections of coil 1433 are shown with symbols, and coils having an "X" extend rotationally into the page, while coils having a "•" extend rotationally out of the page. Elements for plasma generation also include an RF power supply 541 configured to supply RF power to the coil 1433. In general, the RF power supply 1441 is connected to matching circuitry 1439 through a connection 1445. The matching circuitry 1439 is connected to the coil 1433 through a connection 1443. In this manner, the RF power supply 1441 is connected to the coil 1433. An optional Faraday shield **1449*a* is positioned between the coil 1433 and the window 1411. The Faraday shield 1449*a* may be maintained in a spaced apart relationship relative to the coil 1433. In some embodiments, the Faraday shield 1449*a* is disposed immediately above the window 1411. In some embodiments, the Faraday shield 1449*b* is between the window 1411 and the chuck 1417. In some embodiments, the Faraday shield 1449*b* is not maintained in a spaced apart relationship relative to the coil 1433. For example, the Faraday shield 1449*b* may be directly below the window 1411 without a gap. The coil 1433, the Faraday shield 1449*a*, and the window 1411 are each configured to be substantially parallel to one another. The Faraday shield 1449***a* may prevent metal or other species from depositing on the window 1411 of the process chamber 1424.

Process gases may be flowed into the process chamber through one or more main gas flow inlets 1460 positioned in the upper sub-chamber 1402 and/or through one or more side gas flow inlets 1470. Likewise, though not explicitly shown, similar gas flow inlets may be used to supply process gases to a capacitively coupled plasma processing chamber. A vacuum pump, e.g., a one or two stage mechanical dry pump and/or turbomolecular pump 1440, may be used to draw process gases out of the process chamber 1424 and to maintain a pressure within the process chamber 1424. For example, the vacuum pump may be used to evacuate the lower sub-chamber 1403 during a purge operation of ALD. A valve-controlled conduit may be used to fluidically connect the vacuum pump to the process chamber 1424 so as to selectively control application of the vacuum environment provided by the vacuum pump. This may be done employing a closed loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus 1400, one or more process gases may be supplied through the gas flow inlets 1460 and/or 1470. In certain embodiments, process gas may be supplied only through the main gas flow inlet 1460, or only through the side gas flow inlet 1470. In some cases, the gas flow inlets shown in the figure may be replaced by more complex gas flow inlets, one or more showerheads, for example. The Faraday shield 1449*a* and/or optional grid 1450 may include internal channels and holes that allow delivery of process gases to the process chamber 1424. Either or both of Faraday shield 1449*a* and optional grid 1450 may serve as a showerhead for delivery of process gases. In some embodiments, a liquid vaporization and delivery system may be situated upstream of the process chamber 1424, such that once a liquid reactant or precursor is vaporized, the vaporized reactant or precursor is introduced into the process chamber 1424 via a gas flow inlet 1460 and/or 1470.

Radio frequency power is supplied from the RF power supply 1441 to the coil 1433 to cause an RF current to flow through the coil 1433. The RF current flowing through the coil 533 generates an electromagnetic field about the coil 1433. The electromagnetic field generates an inductive current within the upper sub-chamber 1402. The physical and chemical interactions of various generated ions and radicals with the wafer 1419 etch features of and selectively deposit layers on the wafer 1419.

If the plasma grid 1450 is used such that there is both an upper sub-chamber 1402 and a lower sub-chamber 1403, the inductive current acts on the gas present in the upper sub-chamber 1402 to generate an electron-ion plasma in the upper sub-chamber 1402. The optional internal plasma grid 1450 limits the amount of hot electrons in the lower sub-chamber 1403. In some embodiments, the apparatus 1400 is designed and operated such that the plasma present in the lower sub-chamber 1403 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 1403 through port 1422. The chuck 1417 disclosed herein may operate at elevated temperatures ranging between about 10° C. and about 250° C. The temperature will depend on the process operation and specific recipe.

Apparatus 1400 may be coupled to facilities (not shown) when installed in a clean room or a fabrication facility. Facilities include plumbing that provide processing gases, vacuum, temperature control, and environmental particle control. These facilities are coupled to apparatus 1400, when installed in the target fabrication facility. Additionally, apparatus 1400 may be coupled to a transfer chamber that allows robotics to transfer semiconductor wafers into and out of apparatus 1400 using typical automation.

In some embodiments, a system controller 1430 (which may include one or more physical or logical controllers) controls some or all of the operations of a process chamber 1424. The system controller 1430 may include one or more memory devices and one or more processors. In some embodiments, the apparatus 1400 includes a switching system for controlling flow rates and durations when disclosed embodiments are performed. In some embodiments, the apparatus 1400 may have a switching time of up to about 500 ms, or up to about 750 ms. Switching time may depend on the flow chemistry, recipe chosen, reactor architecture, and other factors.

In some embodiments, the system controller 1430 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 1430, which may control various components or subparts of the system or systems. The system controller, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 1430 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 1430, in some embodiments, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 1430 receives instructions in the form of data, which specify parameters for each of the processing steps to be performed during one or more operations. It should be understood that the parameters may be specific to the type of process to be performed and the type of tool that the controller is configured to interface with or control. Thus as described above, the system controller 1430 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, an EUV lithography chamber (scanner) or module, a dry development chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

EUVL patterning may be conducted using any suitable tool, often referred to as a scanner, for example the TWINSCAN NXE: 3300B® platform supplied by ASML of Veldhoven, NL). The EUVL patterning tool may be a standalone device from which the substrate is moved into and out of for deposition and etching as described herein. Or, as described below, the EUVL patterning tool may be a module on a larger multi-component tool. FIG. 15 depicts a semiconductor process cluster tool architecture with vacuum-integrated deposition, EUV patterning and dry development/etch modules that interface with a vacuum transfer module, suitable for implementation of the processes described herein. While the processes may be conducted without such vacuum integrated apparatus, such apparatus may be advantageous in some embodiments.

FIG. 15 depicts a semiconductor process cluster tool architecture with vacuum-integrated deposition and patterning modules that interface with a vacuum transfer module, suitable for implementation of processes described herein. The arrangement of transfer modules to "transfer" wafers among multiple storage facilities and processing modules may be referred to as a "cluster tool architecture" system. Deposition and patterning modules are vacuum-integrated, in accordance with the requirements of a particular process. Other modules, such as for etch, may also be included on the cluster.

A vacuum transport module (VTM) 1538 interfaces with four processing modules **1520*a*-1520*d*, which may be individually optimized to perform various fabrication processes. By way of example, processing modules 1520*a*-1520*d* may be implemented to perform deposition, evaporation, ELD, dry development, etch, strip, and/or other semiconductor processes. For example, module 1520*a* may be an ALD reactor that may be operated to perform in a non-plasma, thermal atomic layer depositions as described herein, such as Vector tool, available from Lam Research Corporation, Fremont, CA. And module 1520*b*** may be a PECVD tool, such as the Lam Vector®. It should be understood that the figure is not necessarily drawn to scale.

Airlocks 1542 and 1546, also known as a loadlocks or transfer modules, interface with the VTM 1538 and a patterning module 1540. For example, as noted above, a suitable patterning module may be the TWINSCAN NXE: 3300B® platform supplied by ASML of Veldhoven, NL). This tool architecture allows for work pieces, such as semiconductor substrates or wafers, to be transferred under vacuum so as not to react before exposure. Integration of the deposition modules with the lithography tool is facilitated by the fact that EUVL also requires a greatly reduced pressure given the strong optical absorption of the incident photons by ambient gases such as $H_2O$, $O_2$, etc.

As noted above, this integrated architecture is just one possible embodiment of a tool for implementation of the described processes. The processes may also be implemented with a more conventional stand-alone EUVL scanner and a deposition reactor, such as a Lam Vector tool, either stand alone or integrated in a cluster architecture with other tools, such as etch, strip etc. (e.g., Lam Kiyo or Gamma tools), as modules, for example as described with reference to FIG. 15 but without the integrated patterning module.

Airlock 1542 may be an "outgoing" loadlock, referring to the transfer of a substrate out from the VTM 1538 serving a deposition module **1520*a* to the patterning module 1540, and airlock 1546 may be an "ingoing" loadlock, referring to the transfer of a substrate from the patterning module 1540 back in to the VTM 1538. The ingoing loadlock 1546 may also provide an interface to the exterior of the tool for access and egress of substrates. Each process module has a facet that interfaces the module to VTM 1538. For example, deposition process module 1520*a* has facet 1536. Inside each facet, sensors, for example, sensors 1-18 as shown, are used to detect the passing of wafer 1526 when moved between respective stations. Patterning module 1540 and airlocks 1542 and 1546** may be similarly equipped with additional facets and sensors, not shown.

Main VTM robot 1522 transfers wafer 1526 between modules, including airlocks 1542 and 1546. In one embodiment, robot 1522 has one arm, and in another embodiment, robot 1522 has two arms, where each arm has an end effector 1524 to pick wafers such as wafer 1526 for transport. Front-end robot 1544, in is used to transfer wafers 1526 from outgoing airlock 1542 into the patterning module 1540, from the patterning module 1540 into ingoing airlock 1546. Front-end robot 1544 may also transport wafers 1526 between the ingoing loadlock and the exterior of the tool for access and egress of substrates. Because ingoing airlock module 1546 has the ability to match the environment between atmospheric and vacuum, the wafer 1526 is able to move between the two pressure environments without being damaged.

It should be noted that a EUVL tool typically operates at a higher vacuum than a deposition tool. If this is the case, it is desirable to increase the vacuum environment of the substrate during the transfer between the deposition to the EUVL tool to allow the substrate to degas prior to entry into the patterning tool. Outgoing airlock 1542 may provide this function by holding the transferred wafers at a lower pressure, no higher than the pressure in the patterning module 1540, for a period of time and exhausting any off-gassing, so that the optics of the patterning tool 1540 are not contaminated by off-gassing from the substrate. A suitable pressure for the outgoing, off-gassing airlock is no more than 1E-8 Torr.

In some embodiments, a system controller 1550 (which may include one or more physical or logical controllers) controls some or all of the operations of the cluster tool and/or its separate modules. It should be noted that the controller can be local to the cluster architecture, or can be located external to the cluster architecture in the manufacturing floor, or in a remote location and connected to the cluster architecture via a network. The system controller 1550 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller or they may be provided over a network. In certain embodiments, the system controller executes system control software.

The system control software may include instructions for controlling the timing of application and/or magnitude of any aspect of tool or module operation. System control software may be configured in any suitable way. For example, various process tool component subroutines or control objects may be written to control operations of the process tool components necessary to carry out various process tool processes. System control software may be coded in any suitable compute readable programming language. In some embodiments, system control software includes input/output control (IOC) sequencing instructions for controlling the various parameters described above. For example, each phase of a semiconductor fabrication process may include one or more instructions for execution by the system controller. The instructions for setting process conditions for condensation, deposition, evaporation, patterning and/or etching phase may be included in a corresponding recipe phase, for example.

In various embodiments, an apparatus for forming a negative pattern mask is provided. The apparatus may include a processing chamber for patterning, deposition and etch, and a controller including instructions for forming a negative pattern mask. The instructions may include code for, in the processing chamber, patterning a feature in a chemically amplified (CAR) resist on a semiconductor substrate by EUV exposure to expose a surface of the substrate, developing the photopatterned resist, and etching the underlying layer or layer stack using the patterned resist as a mask. Development may be performed using a halide-containing chemistry.

It should be noted that the computer controlling the wafer movement can be local to the cluster architecture, or can be located external to the cluster architecture in the manufacturing floor, or in a remote location and connected to the cluster architecture via a network. A controller as described above with respect to any of FIG. 12, 13 or 14 may be implemented with the tool in FIG. 15.

CONCLUSION

Process and apparatus for dry development of metal and/or metal oxide photoresists, for example to form a patterning mask in the context of EUV patterning is disclosed.

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the disclosure is not to be limited to the details given herein, but may be modified within the scope of the disclosure.

The invention claimed is:

1. An apparatus for processing a semiconductor substrate, the apparatus comprising:

a process chamber with a substrate support;

a vacuum line coupled to the process chamber;

a development chemistry line coupled to the process chamber; and a controller configured with instructions for processing a semiconductor substrate, the instructions comprising code for:

dry developing a photopatterned EUV resist using an etch gas in a plasma-free thermal process to form a resist mask on the semiconductor substrate, wherein the photopatterned EUV resist comprises an unexposed organo-metal-oxide-containing portion with organo-metal-oxide networks and metal-carbon bonds and an EUV-exposed metal-oxide-containing portion with metal-oxide networks that lost the metal-carbon bonds, wherein the etch gas comprises a halide etchant that breaks metal-oxide bonds in the organo-metal-oxide networks in the unexposed organo-metal-oxide-containing portion to form one or more volatile byproducts while leaving metal-oxide bonds intact in the metal-oxide networks in the EUV-exposed metal-oxide-containing portion to form the resist mask.

2. The apparatus of claim 1, further comprising:

an exhaust system coupled to the process chamber configured to remove the one or more volatile byproducts from the process chamber.

3. The apparatus of claim 1, further comprising:

a thermocouple configured to control a temperature of the semiconductor substrate, wherein the controller configured with instructions comprising code for dry developing the photopatterned EUV resist comprises code for:

dry developing the photopatterned EUV resist with HBr at a temperature between about −60° C. and about 60° C.

4. The apparatus of claim 1, wherein the controller configured with instructions comprising code for dry developing the photopatterned EUV resist comprises code for:

dry developing the photopatterned EUV resist using a dry development chemistry comprising HBr and/or HCl.

5. The apparatus of claim 1, wherein the controller configured with instructions comprising code for dry developing the photopatterned EUV resist comprises code for:

controlling flow of a plurality of different halide etchants for dry development simultaneously or sequentially.

6. The apparatus of claim 1, further comprising:

an RF power supply; and a plasma source, wherein the controller is further configured with instructions comprising code for:

descumming or smoothing the resist mask by exposure to plasma after dry developing the photopatterned EUV resist in a plasma-free thermal process.

7. An apparatus for processing a semiconductor substrate, the apparatus comprising:

a process chamber with a substrate support;

a vacuum line coupled to the process chamber;

a development chemistry line coupled to the process chamber; and a controller configured with instructions for processing a semiconductor substrate, the instructions comprising code for:

dry developing a photopatterned EUV resist comprising an unexposed organo-metal-oxide-containing portion with organo-metal-oxide networks and metal-carbon bonds and an EUV-exposed metal-oxide-containing portion with metal-oxide networks that lost the metal-carbon bonds using a dry development chemistry comprising a halide etchant to form a resist mask, wherein the halide etchant selectively removes the unexposed organo-metal-oxide-containing portion relative to the EUV-exposed metal-oxide-containing portion to form the resist mask, wherein the halide etchant breaks metal-oxide bonds in the organo-metal-oxide networks in the unexposed organo-metal-oxide-containing portion to form one or more volatile byproducts while leaving metal-oxide bonds intact in the metal-oxide networks in the EUV-exposed metal-oxide-containing portion to form the resist mask.

8. The apparatus of claim 7, further comprising:

an exhaust system coupled to the process chamber configured to remove the one or more volatile byproducts from the process chamber.

9. The apparatus of claim 7, further comprising:

a thermocouple configured to control a temperature of the semiconductor substrate, wherein the controller configured with instructions comprising code for dry developing the photopatterned EUV resist comprises code for:

dry developing the photopatterned EUV resist with HBr at a temperature between about −60° C. and about 60° C.

10. The apparatus of claim 7, wherein the controller configured with instructions comprising code for dry developing the photopatterned EUV resist comprises code for:

dry developing the photopatterned EUV resist using a dry development chemistry comprising HBr and/or HCl.

11. The apparatus of claim 7, wherein the controller configured with instructions comprising code for dry developing the photopatterned EUV resist comprises code for:

controlling flow of a plurality of different halide etchants for dry development simultaneously or sequentially.

12. The apparatus of claim 7, further comprising:

an RF power supply; and a plasma source, wherein the controller configured with instructions comprising code for dry developing the photopatterned EUV resist comprises code for:

dry developing the photopatterned EUV resist with exposure to a hydrogen halide in a plasma-free thermal process followed by exposure to plasma using the plasma source and the RF power supply.

* * * * *